(12) United States Patent
Shimizu et al.

(10) Patent No.: US 7,732,919 B2
(45) Date of Patent: Jun. 8, 2010

(54) SEMICONDUCTOR DEVICE

(75) Inventors: Ichio Shimizu, Tokyo (JP); Kenya Kawano, Tokyo (JP); Kisho Ashida, Tokyo (JP); Yuichi Machida, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/362,354

(22) Filed: Jan. 29, 2009

(65) Prior Publication Data
US 2009/0190320 A1     Jul. 30, 2009

(30) Foreign Application Priority Data
Jan. 29, 2008  (JP)  .............................. 2008-017650

(51) Int. Cl.
*H01L 23/34*     (2006.01)
(52) U.S. Cl. .................. 257/724; 257/666; 257/532
(58) Field of Classification Search ................. 257/723, 257/724, 666, 787, 532
See application file for complete search history.

(56) References Cited
U.S. PATENT DOCUMENTS

| | | | |
|---|---|---|---|
| 5,804,880 A * | 9/1998 | Mathew | 257/779 |
| 7,489,021 B2 * | 2/2009 | Juskey et al. | 257/666 |
| 7,528,460 B2 * | 5/2009 | Nishimura et al. | 257/528 |
| 2004/0238940 A1 | 12/2004 | Ebine et al. | |
| 2005/0173783 A1 * | 8/2005 | Chow et al. | 257/666 |
| 2005/0218489 A1 | 10/2005 | Satou et al. | |
| 2007/0138632 A1 * | 6/2007 | Tsai et al. | 257/724 |
| 2007/0246806 A1 * | 10/2007 | Ong et al. | 257/666 |
| 2009/0079066 A1 * | 3/2009 | Jang | 257/724 |

FOREIGN PATENT DOCUMENTS

| | | |
|---|---|---|
| JP | 2002-124616 | 4/2002 |
| JP | 2003-243595 | 8/2003 |
| JP | 2004-296624 | 10/2004 |
| JP | 2004-356494 | 12/2004 |
| JP | 2005-294464 | 10/2005 |

* cited by examiner

*Primary Examiner*—S. V Clark
(74) *Attorney, Agent, or Firm*—Miles & Stockbridge P.C.

(57) ABSTRACT

Coupling reliability of a passive component is improved to increase the reliability of a semiconductor device. A first through hole is formed in a first electrode part of a first plate-like lead, and a second through hole is formed in a second electrode part of a second plate-like lead. As a result, at the first electrode part of the first plate-like lead, one external terminal of the passive component can be coupled to the first electrode parts on both sides of the first through hole while being laid across the first through hole. Also, at the second electrode part of the second plate-like lead, the other external terminal of the passive component can be coupled to the second electrode parts on both sides of the second through hole while being laid across the second through hole. Accordingly, at central portions both in the longitudinal and width directions of the passive component, the passive component is surrounded by sealing members. As a result, thermal stress applied to jointing materials such as solder can be reduced, improving the reliability of the semiconductor device (semiconductor package).

22 Claims, 29 Drawing Sheets

(b) x=0μm (c) x=-20μm

SEMICONDUCTOR DEVICE

CROSS-REFERENCE TO RELATED APPLICATIONS

The disclosure of Japanese Patent Application No. 2008-17650 filed on Jan. 29, 2008 including the specification, drawings and abstract is incorporated herein by reference in its entirety.

BACKGROUND OF THE INVENTION

The present invention relates to a semiconductor device. More particularly, the present invention relates to a technique effectively applicable to a semiconductor device having a passive component and semiconductor chips integrated as one package.

As a CPU (Central Processing Unit) used in, for example, a personal computer, a server, a game machine, etc., becomes highly efficient, a power supply circuit for driving the CPU has been required to have a high-speed response, large-current capability, as well as higher integration.

A DC-DC converter, which is used as a power supply circuit, has a structure in which a power MOSFET for a high side and a power MOSFET for a low side are coupled in series, and is controlled by a driver circuit (driver IC).

In order to realize a higher-speed and more efficient DC-DC converter, there is a semiconductor device in which there are mounted on a lead frame a semiconductor chip in which a power MOSFET for a high side is formed, a semiconductor chip in which a power MOSFET on a low side is formed, and a semiconductor chip in which a driver circuit is formed, and are integrated as one package (see, for example, Japanese Patent Laid-open No. 2005-294464).

Also, a passive component such as a capacity element is required for the purpose of stabilizing the power voltage supplied to the DC-DC converter. Conventionally, this passive component is arranged, for example, outside the package disclosed in Japanese Patent Laid-open No. 2005-294464.

The present inventors have studied to achieve a highly efficient semiconductor device by providing a passive component in a package in which a power MOSFET and a driver circuit are mounted on a lead frame, and found out a problem when mounting the passive component on the lead frame.

Further, techniques for mounting a passive component on a lead frame are disclosed, for example, in Japanese Patent Laid-open No. 2004-296624, Japanese Patent Laid-open No. 2004-356494, and Japanese Patent Laid-open No. 2002-124616. Also, a technique for mounting a semiconductor chip and a passive component in the same package is disclosed, for example, in Japanese Patent Laid-open No. 2003-243595.

SUMMARY OF THE INVENTION

When mounting a passive component in the package, the passive component is fixed between two lead frames through jointing materials such as solder, and is covered with an insulating resin. In this structure, the lead frame is made of an alloy of copper, for example, the passive component is made of ceramics, for example, and the insulating resin is an epoxy resin, for example.

Therefore, since the thermal expansion coefficients ($\alpha$) of respective components differ, a stress (thermal stress) is applied to a jointing material (for example, solder) according to a difference in thermal expansion at the time of a reflow and a temperature cycle which may result in a fracture of the jointing material. The thermal expansion coefficients of respective materials are, for example, about 18 ppm/K in the alloy of copper, about 5 ppm/K in the ceramics, and about 15 ppm/K in the epoxy resin.

Therefore, according to the difference in the thermal expansion coefficients ($\alpha$) of these components, at the time of a high-temperature treatment, a stress occurs according to the difference in thermal expansion of respective components. This stress is given to the jointing material, and may cause a fracture of the jointing material (such as solder), or cause interfacial exfoliation of the jointing material and a lead.

An object of the present invention is to realize a highly efficient semiconductor device by integrating a semiconductor chip and a passive component as one package.

Further, another object of the present invention is to improve joining reliability when mounting the passive component on the lead frame, and to make the semiconductor device more reliable.

The above and other objects and novel features will become apparent from the description of the specification and the accompanying drawings.

Outlines of representative ones of the inventions disclosed in the present application will be briefly described as follows.

That is, a semiconductor device of the present invention includes: a first plate-like lead having a first electrode part electrically coupled to an external terminal at one end of a passive component on the both ends of which external terminals are formed, the first electrode part being provided with a first concave portion; and a second plate-like lead having a second electrode part spaced from the first plate-like lead and electrically coupled to an external terminal at the other end of the passive component, the second electrode part being provided with a second concave portion. The semiconductor device of the present invention further includes: jointing materials electrically coupling the first electrode part of the first plate-like lead with the one external terminal of the passive component and, also, the second electrode part of the second plate-like lead with the other external terminal of the passive component, respectively; and sealing members for sealing the passive component and the semiconductor chip with a resin. Further, at the first electrode part of the first plate-like lead, the one external terminals of the passive component are coupled to the first electrode parts on both sides of the first concave portion being laid across the first concave portion and, at the second electrode part of the second plate-like lead, the other external terminals of the passive component are coupled to the second electrode parts on both sides of the second concave portion being laid across the second concave portion. Still further, the external terminals of the passive component are coupled, at four corners, to either the first electrode part of the first plate-like lead or the second electrode part of the second plate-like lead using the jointing materials, and a region between the external terminals on both the sides of the passive component is surrounded by part of the sealing member.

Also, a semiconductor device of the present invention includes: a first plate-like lead having a first electrode part electrically coupled to an external terminal at one end of the passive component on the both ends of which external terminals are formed, the first plate-like lead being provided with a pair of first concave portions sandwiching the first electrode part; and a second plate-like lead having a second electrode part spaced from the first plate-like lead and electrically coupled to an external terminal at the other end of the passive component, the second plate-like lead being provided with a pair of second concave portions sandwiching the second electrode part. The semiconductor device of the present invention further includes: jointing materials electrically coupling the first electrode part of the first plate-like lead with the one external terminal of the passive component and, also, the second electrode part of the second plate-like lead with the other external terminal of the passive component, respectively; and a sealing member for sealing the passive component and the semiconductor chip with a resin. Further, at the first electrode part of the first plate-like lead, the one external terminal of the passive component is coupled to the first electrode part while being laid across the pair of the first concave portions so provided as to sandwich the first electrode part and, at the second electrode part of the second plate-like lead, the other external terminal of the passive component is coupled to the second electrode part while being laid across the pair of the second concave portions so provided as to sandwich the second electrode part. Still further, a region between the external terminals on both the sides of the passive component is surrounded by part of the sealing member.

Also, a semiconductor device of the present invention includes: a first semiconductor chip mounted on a first lead frame in which a high-side MOSFET being a component for the DC-DC converter is formed; a second lead frame opposed to the first lead frame; a second semiconductor chip mounted on a third lead frame in which a low-side MOSFET being a component for the DC-DC converter is formed; a third semiconductor chip, mounted on a fourth lead frame, in which a driver circuit for driving the high-side MOSFET and low-side MOSFET is formed; a passive component having two terminals; and an insulating resin covering the first to third semiconductor chips and the passive component. The second semiconductor chip is electrically coupled to the second lead frames, concave portions are formed at positions to which the first and second lead frames are opposed respectively, and the two terminals of the passive component are respectively fixed, via conductive jointing materials, in the concave portions formed in the first and second lead frames.

Effects of representative ones of the inventions disclosed in the present application will be briefly described as follows.

A highly efficient semiconductor device can be realized by mounting a semiconductor chip and a passive component on a lead frame to be integrated as one package.

Moreover, when the passive component is mounted on the lead frame, joining reliability can be increased and the more reliable semiconductor device can be made.

DESCRIPTION OF THE PREFERRED EMBODIMENTS

In the embodiments described below, the description will be made after being divided into plural sections or embodiments when required as a matter of convenience. However, these sections or embodiments are not irrelevant to each other unless clearly specified to the contrary, and the one relates to the entire or a part of the other as a modification example, details, or a supplementary explanation thereof.

Moreover, in the embodiments described below, when referring to the number of an element (including number of pieces, values, amount, range, or the like), the number of the element is not limited to a specific number unless clearly specified or except the case where the number is apparently limited to a specific number in principle. The number larger or smaller than the specific number is applicable.

Further, in the embodiments described below, it goes without saying that the components (including element steps) are not always indispensable unless clearly specified or except the case where the components are apparently indispensable in principle.

Similarly, in the embodiments described below, when the shape of the components, positional relation thereof, and the like are mentioned, the substantially approximate and similar shapes and the like are included therein unless clearly specified to the contrary or except the case where it can be conceived that they are apparently excluded in principle. This condition is also applicable to the numerical value and the range described above.

Hereafter, embodiments of the present invention will be described based on the drawings. Also, the components having the same function are added by the same reference symbol in the entire drawings for describing the embodiments, and repetitive descriptions thereof will be omitted.

First Embodiment

Figure 1:
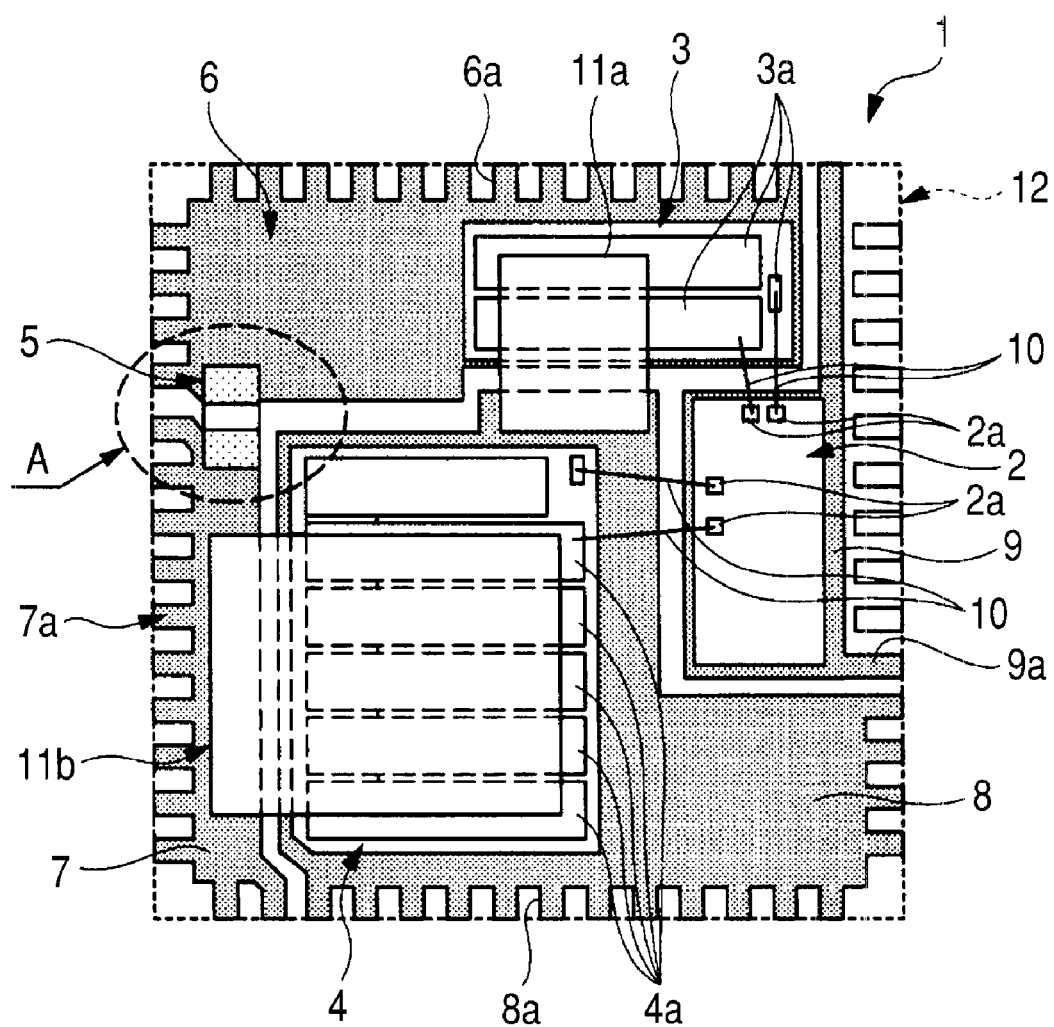
FIG. 1 is a plan view showing, through a sealing member, an example of a structure of a semiconductor device of a first embodiment according to the present invention.
Figure 2:
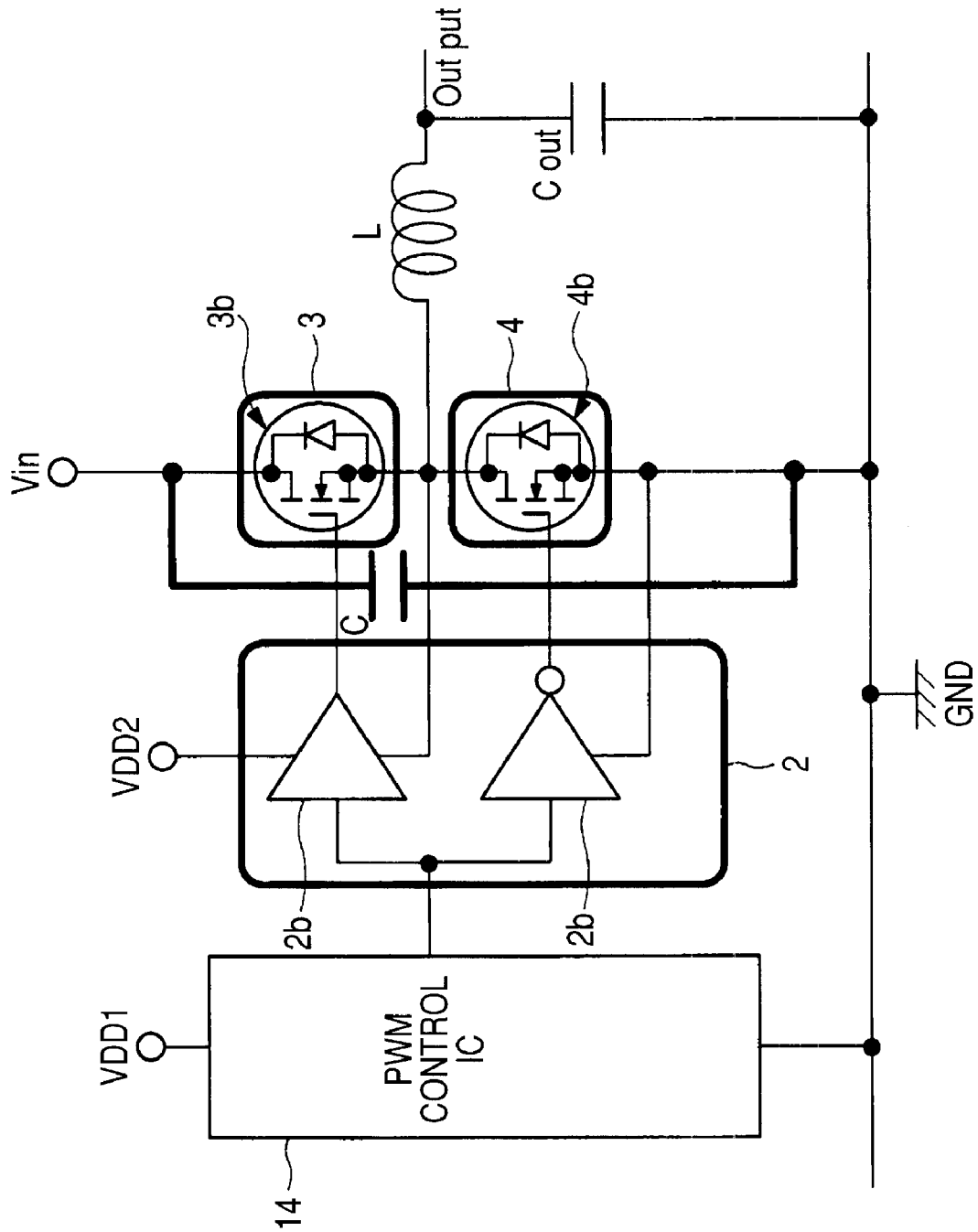
FIG. 2 is a circuit diagram showing an example of a circuit configuration of the semiconductor device shown in FIG. 1 and an example of a circuit configuration of a power supply VR using the semiconductor device.
Figure 3:
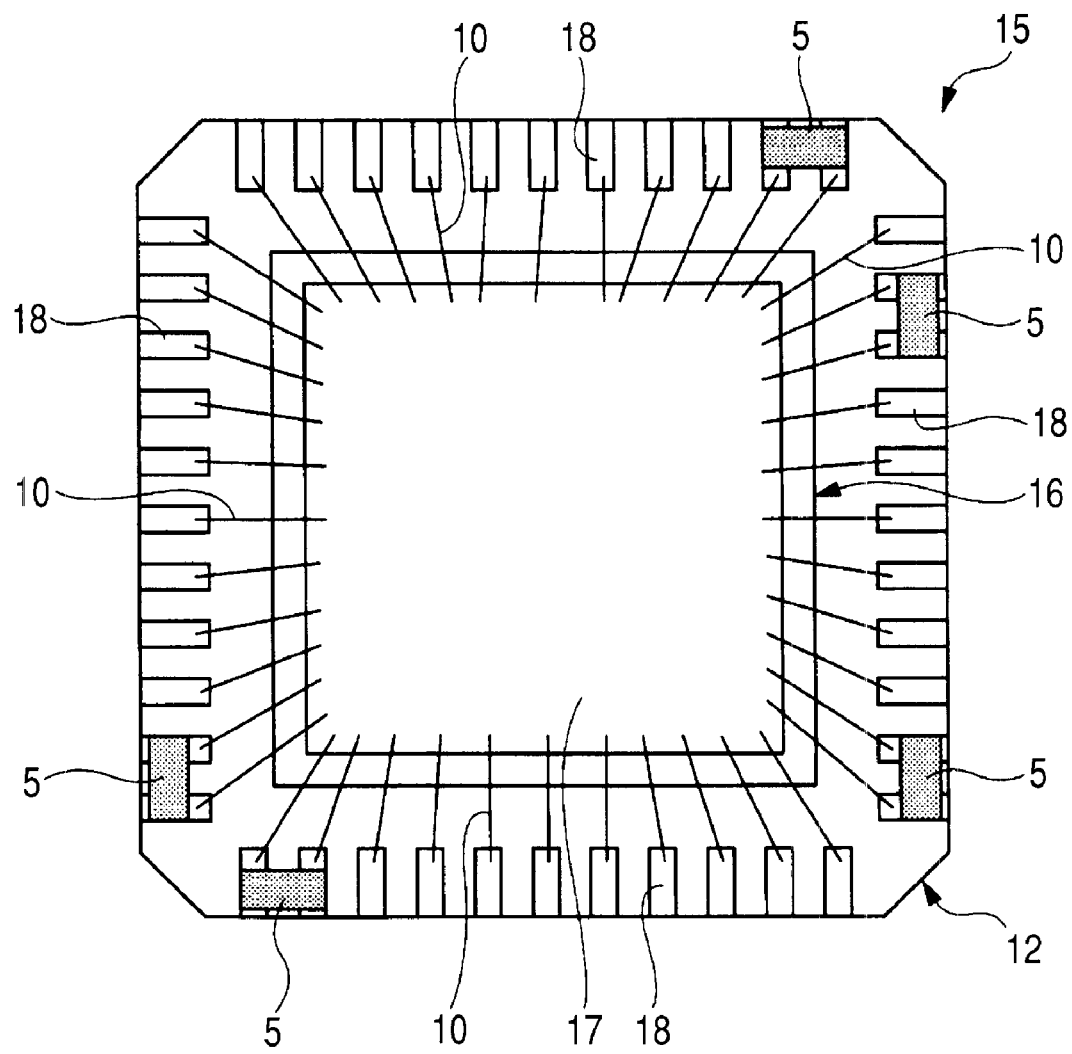
FIG. 3 is a plan view showing, through the sealing member, a structure of a semiconductor device of a modification of the first embodiment of the present invention.
Figure 4:
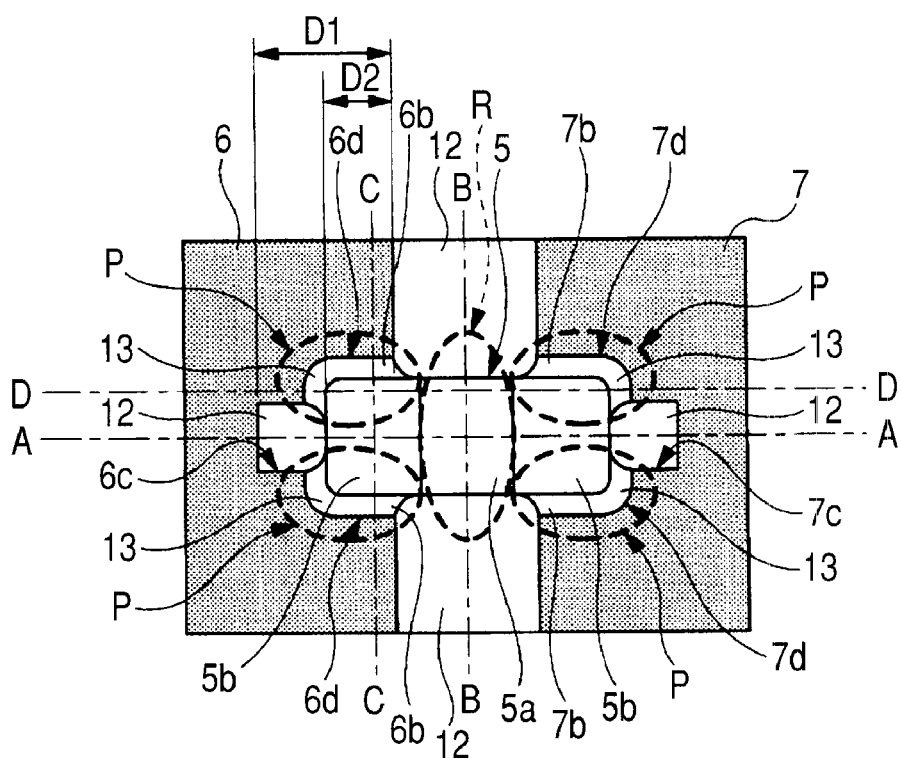
FIG. 4 is a partially enlarged plan view showing an example of a structure of the A region of FIG. 1.
Figure 5:
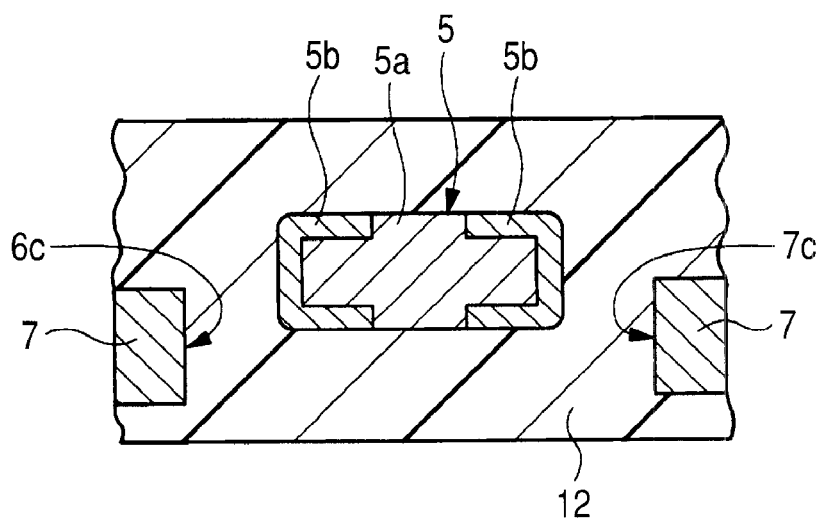
FIG. 5 is a sectional view showing an example of the structure cut along a line A-A in FIG. 4.
Figure 6:
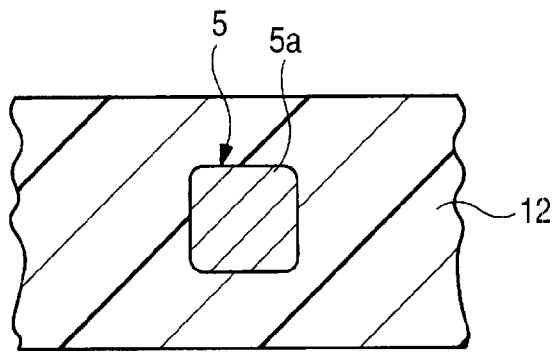
FIG. 6 is a sectional view showing an example of the structure cut along a line B-B in FIG. 4.
Figure 7:
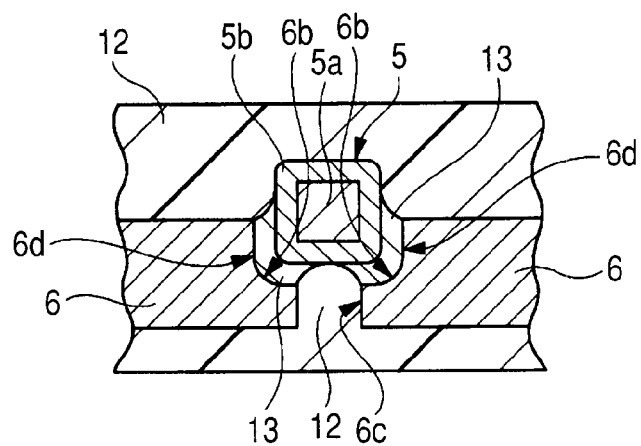
FIG. 7 is a sectional view showing an example of the structure cut along a line C-C in FIG. 4.
Figure 8:
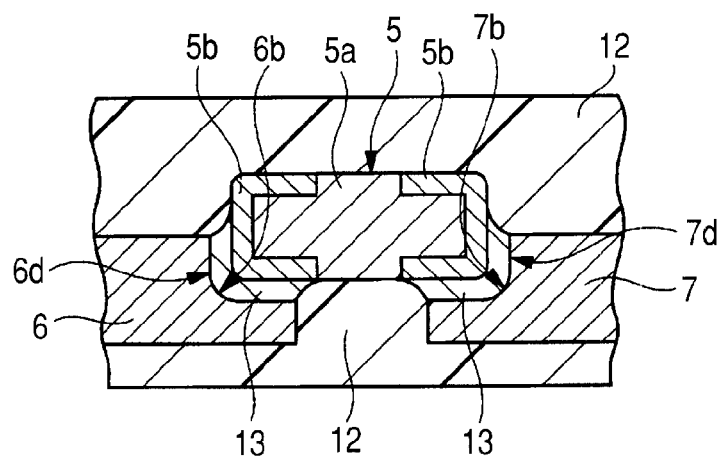
FIG. 8 is a sectional view showing an example of the structure cut along a line D-D in FIG. 4.
Figure 9:
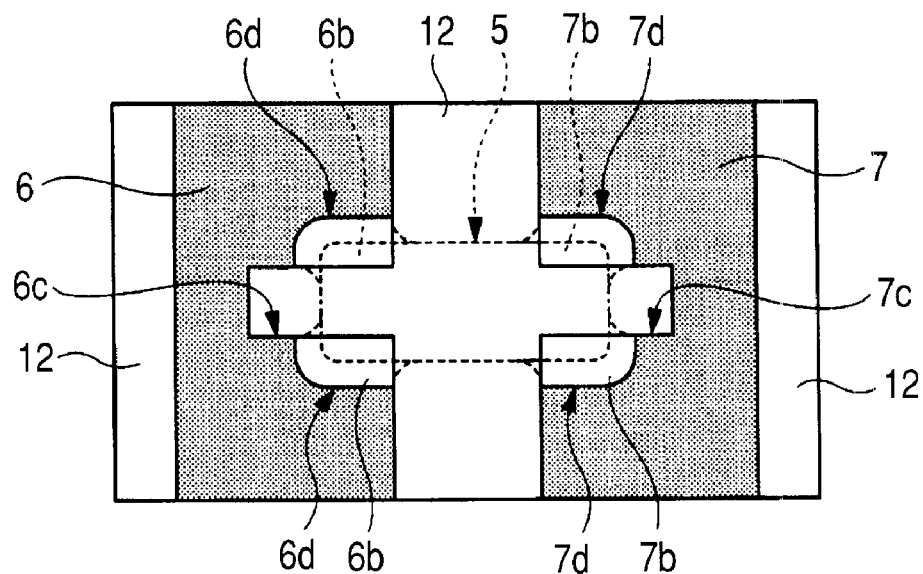
FIG. 9 is a plan view showing an example of a structure of first and second plate-like leads of the structure shown in FIG. 4.
Figure 10:
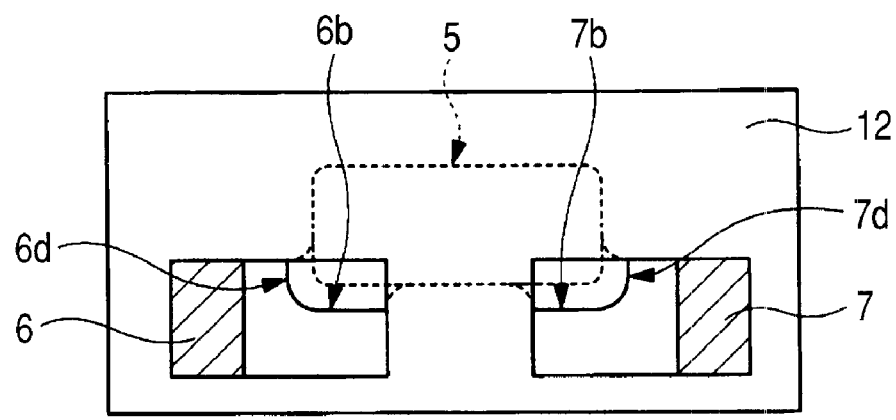
FIG. 10 is a sectional view showing an example of the structure in which the plate-like lead of FIG. 9 is cut at its central portion.
Figure 13:
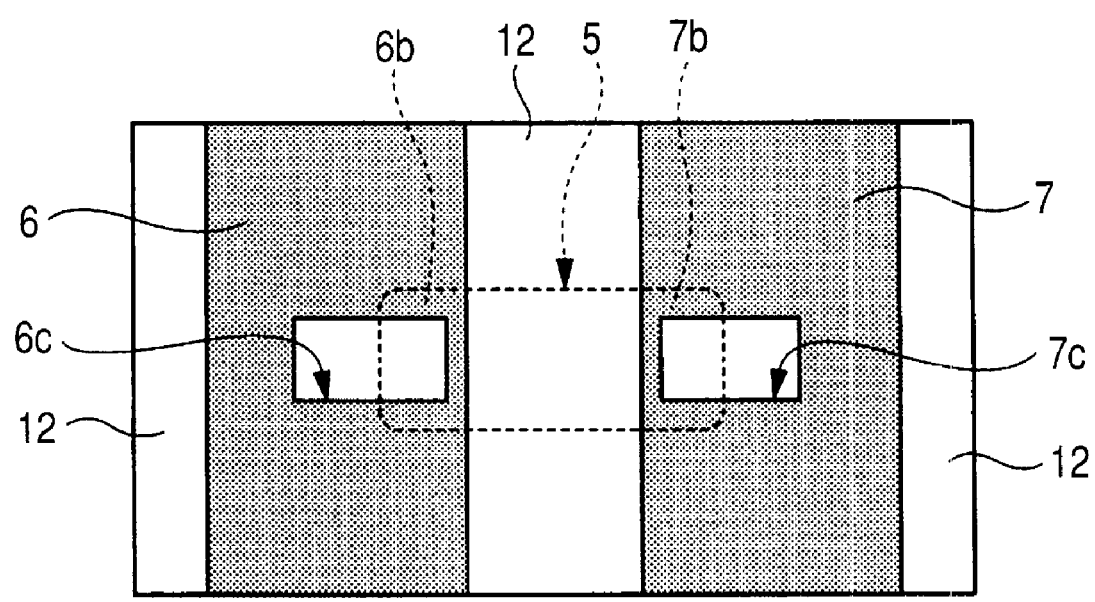
FIG. 13 is a plan view showing a structure of first and second plate-like leads of a modification of the structure of FIG. 9.

FIG. 1 is a plan view showing, through a sealing member, an example of the structure of the semiconductor device of a first embodiment according to the present invention. FIG. 2 is a circuit diagram showing an example of a circuit configuration of the semiconductor device of FIG. 1 and an example of a circuit configuration of a power supply VR using the semiconductor device. FIG. 3 is a plan view showing, through the sealing member, a modification of the structure of the semiconductor device of the first embodiment according to the present invention. FIG. 4 is a partially enlarged plan view showing an example of the structure of the region A in FIG. 1. FIG. 5 is a sectional view of the example of the structure cut along a line A-A in FIG. 4. FIG. 6 is a sectional view of the example of the structure cut along a line B-B in FIG. 4. FIG. 7 is a sectional view of the example of the structure cut along a line C-C in FIG. 4. FIG. 8 is a sectional view of the example of the structure cut along a line D-D in FIG. 4. Further, FIG. 9 is a plan view showing an example of structures of the first and second plate-like leads shown in FIG. 4. FIG. 10 is a sectional view showing an example of a structure in which the plate-like leads of FIG. 9 are cut at the central portion. FIG. 13 is a plan view showing a structure of the first and second plate-like leads of the modification of the structure shown in FIG. 9.

Figure 14:
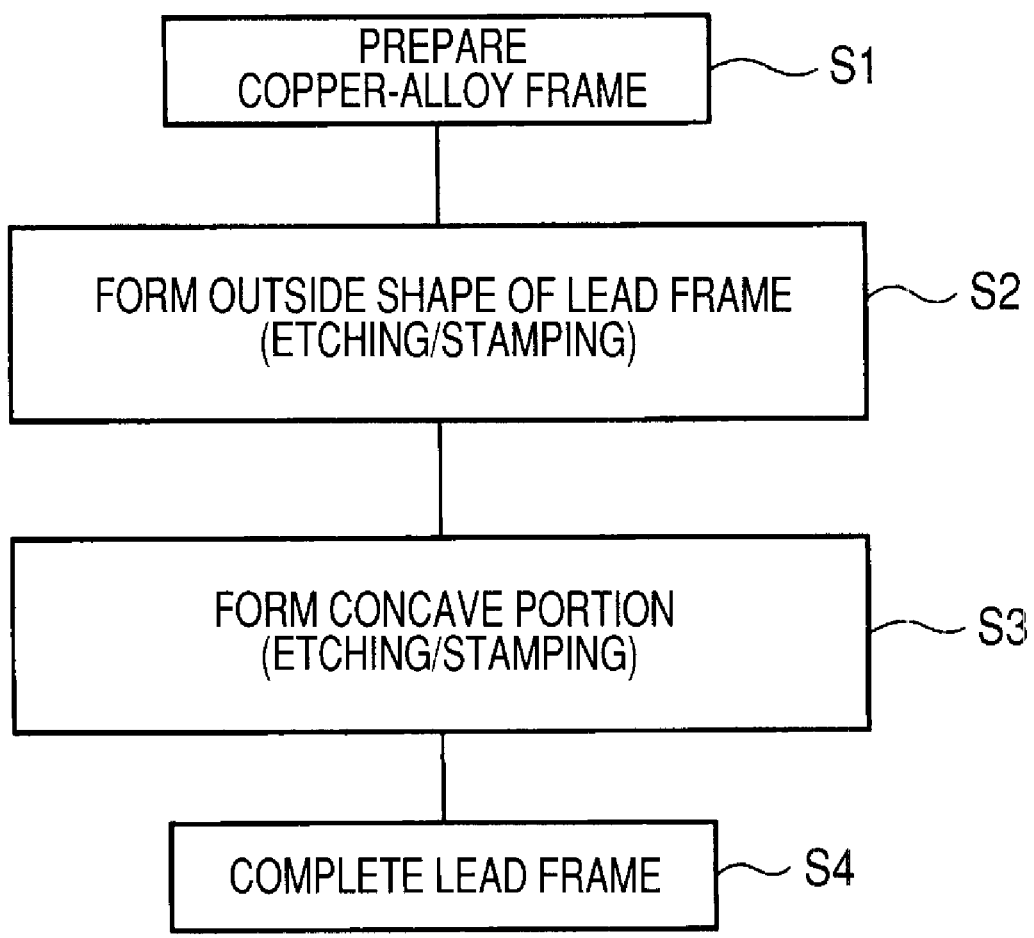
FIG. 14 is a flowchart showing an example of a manufacturing method of a lead frame which is used for assembling the semiconductor device of FIG. 1.
Figure 15:
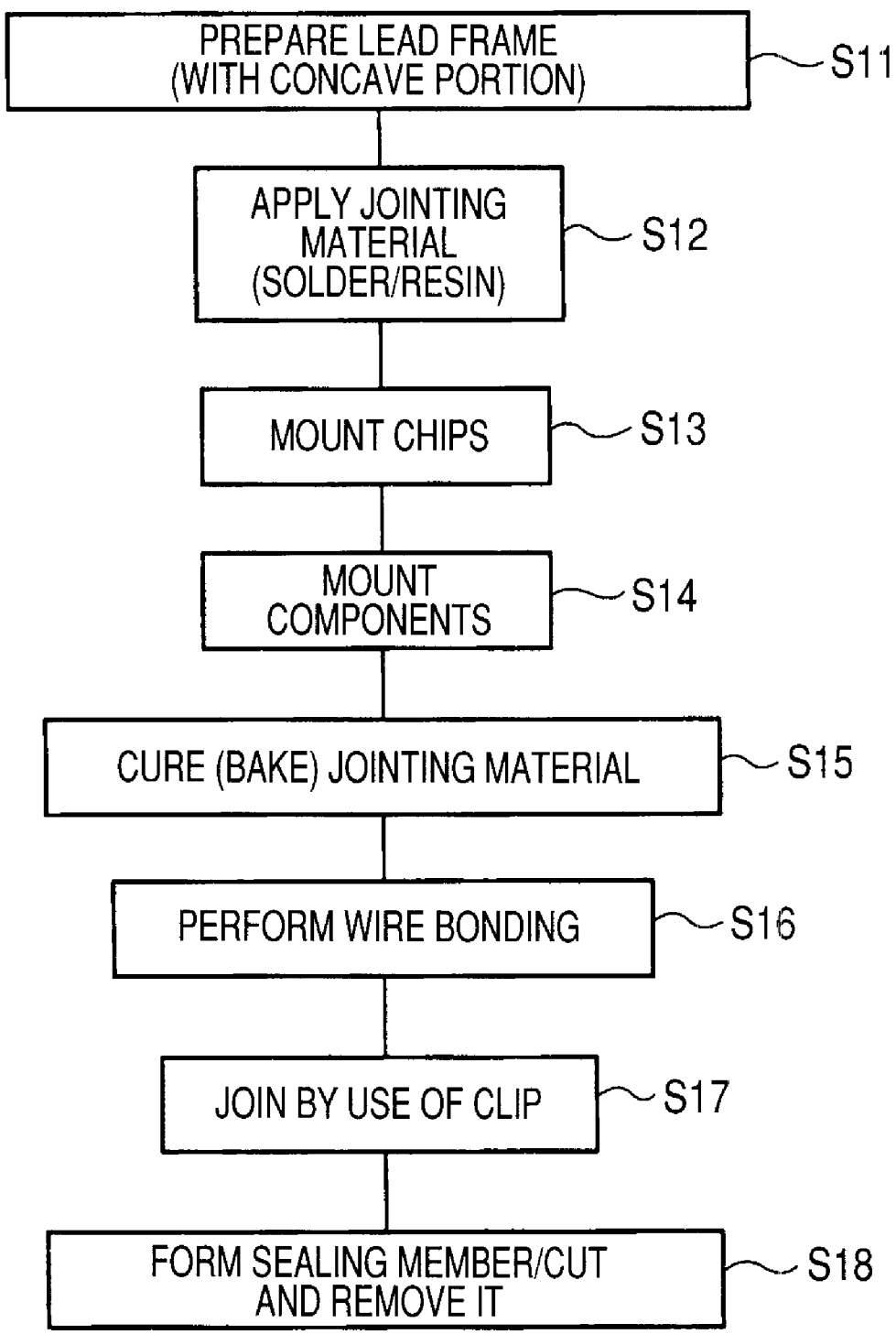
FIG. 15 is a flowchart showing an example of a manufacturing method of the semiconductor device of FIG. 1.

Moreover, FIG. 14 is a flowchart showing an example of a manufacturing method of a lead frame used for assembling the semiconductor device of FIG. 1. FIG. 15 is a flowchart showing an example of a manufacturing method of the semiconductor device of FIG. 1.

The semiconductor chip according to the first embodiment shown in FIG. 1 is a semiconductor package 1 of a resin-seal type in which a semiconductor chip and a passive component being a chip component are mounted together. In this specification, a multi-chip driver MOSFET integrated SIP (System In Package) as shown in FIG. 2, used for a power supply system etc. for a CPU (Central Processing Unit) will be explained as an example.

First, a configuration of the semiconductor package 1 shown in FIG. 1 will be explained. There are provided in the semiconductor package 1 a first plate-like lead (a first lead frame) 6, a second plate-like lead (a second lead frame) 7, a third plate-like lead (a third lead frame) 8, and a fourth plate-like lead (a fourth lead frame) 9 spaced from one another. Further, the semiconductor package 1 includes: a power MOSFET chip (High-side) 3 which is a first semiconductor chip mounted on the first plate-like lead 6; a power MOSFET chip (Low-side) 4 which is a second semiconductor chip mounted on a third plate-like lead 8; a driver IC chip 2 which is a third semiconductor chip mounted on the fourth plate-like lead 9; and a passive component 5 being laid across the first plate-like lead 6 and the second plate-like lead 7.

The passive component 5 is a chip component. The passive component 5 may be, for example, a capacitor, a resistor, an inductor, or the like. As an example, a chip capacitor C mounted on the semiconductor package 1 incorporated in a power supply system shown in FIG. 2 is the passive component 5 of the first embodiment. This passive component 5 is used, for example, to stabilize the power supply. As an example of the power supply circuit, such a DC-DC converter is widely used that has a structure in which the power MOSFET chip 3 and the power MOSFET chip 4 are coupled in series which are controlled by the driver IC chip 2.

In the semiconductor package 1, the power MOSFET chip 3 and the power MOSFET chip 4 are driven by the driver IC chip 2. Therefore, a pad 2a of the driver IC chip 2 and a pad 3a of the power MOSFET chip 3 are electrically coupled by a conductive wire 10. In the same way, the pad 2a of the driver IC chip 2 and a pad 4a of the power MOSFET chip 4 are electrically coupled by the conductive wire 10.

In the power supply system shown in FIG. 2, a control circuit incorporated in a control IC 14 is a circuit which controls operations of the power MOSFET chip 3 and the power MOSFET chip 4. For example, the control circuit is comprised of a pulse width modulation (PWM) circuit. The pulse width modulation circuit compares a command signal with an amplitude of a triangular wave, and outputs a PWM signal (control signal). The PWM signal is used to control the output voltage of the power MOSFET chips 3 and 4 (namely, the pulse width for the turn-on and off of the power MOSFET chips 3 and 4 (ON time)).

An output of the control circuit incorporated in the control IC 14 is electrically coupled to an input of the driver circuit incorporated in the driver IC chip 2. Outputs of the driver circuit of the driver IC chip 2 are electrically coupled to gate terminals of the power MOSFET chips 3 and 4, respectively. According to the PWM signal supplied from the control circuit of the control IC 14, the driver circuit controls electric potentials at the gate terminals of the power MOSFET chips 3 and 4, and controls operations of the power MOSFET chips 3 and 4.

In addition, the first to fourth plate-like leads 6 to 9 are plate-like leads which are respectively made of an alloy of copper, or the like. The first to fourth plate-like leads 6 to 9 are provided with external terminals 6a to 9a which serve, respectively, as terminals for the external coupling of the semiconductor package 1.

Moreover, the pad 3a of the high-side power MOSFET chip 3 is electrically coupled, via a clip 11a being a conductive contact plate, to the third plate-like lead 8 to which a rear electrode of the low-side power MOSFET chip 4 is coupled. Furthermore, the pad 4a of the low-side power MOSFET chip 4 is electrically coupled, by use of a clip 11b, to the second plate-like lead 7 which is electrically coupled with the passive component 5.

The passive component 5 includes a body part 5a and external terminals 5b formed at both ends of the body part 5a. As shown in FIG. 8, an external terminal 5b at one end is electrically coupled to a first electrode part 6b of the first plate-like lead 6. At the same time, an external terminal 5b at the other end is electrically coupled to the second electrode part 7b of the second plate-like lead 7 which is spaced from the first plate-like lead 6. Part of the sealing member 12 filled with a seal resin is provided between the first plate-like lead 6 and the second plate-like lead 7. In addition, the body part 5a of the passive component 5 is formed of, for example, ceramics or the like.

As shown in FIG. 8, the external terminals 5b at both the ends of the passive component 5 are electrically coupled, respectively, via the jointing materials 13 such as solder, a conductive resin adhesive, or the like, to the first electrode part 6b of the first plate-like lead 6 or the second electrode part 7b of the second plate-like lead 7. That is, at positions to which the first plate-like lead 6 and the second plate-like lead 7 are opposed, concave portions are formed respectively. Further, the two external terminals 5b of the passive component 5 are fixed respectively, via the conductive jointing materials 13, to the concave portions formed in the first plate-like lead 6 and the second plate-like lead 7.

Also, the passive component 5 is not limited to the capacitor, and it may be a chip resister, a chip inductor, or the like.

Further, in the semiconductor package 1, the driver IC chip 2, the power MOSFET chip 3, the power MOSFET chip 4, the passive component 5, a wire 10, clips 11a and 11b, and first to fourth plate-like leads 6 to 9 are covered with a resin sealing member 12 and sealed with a resin. In addition, plural external terminals 6a, 7a, 8a, and 9a of the semiconductor package 1 are exposed from a peripheral part of the rear side of the sealing member 12 and can be electrically coupled to electrodes, or the like of a package substrate.

Moreover, in the semiconductor package 1, as a heat dissipation measure, there are exposed from the sealing member 12 a rear surface of the first plate-like lead 6, a rear surface of the third plate-like lead 8, a rear surface of the fourth plate-like lead 9, and surfaces of clips 11a and 11b.

In addition, the sealing member 12 is made of, for example, an epoxy insulating mould resin.

Thermal expansion coefficients of the passive component and main members arranged around it of the semiconductor package 1 are as follows. For example, an alloy of copper; about 18 ppm/K, ceramics; about 5 ppm/K, and an epoxy resin; about 15 ppm/K. However, the thermal expansion coefficients of the main members are not limited to these.

Next, a semiconductor device of a modification of the first embodiment of FIG. 3 will be described.

The semiconductor device shown in FIG. 3 is a non-leaded type QFN (Quad Flat Non-leaded Package) 15. Plural leads 18 are arranged around an IC chip 17, which is a semiconductor chip mounted on the tab 16. The semiconductor device of FIG. 3 is also a resin-seal type, and an electrode of the IC chip 17 and its corresponding lead 18 are electrically coupled by a conductive wire 10.

That is, the IC chip 17 and plural wires 10 are resin-sealed by the sealing member 12 made of the seal resin. On a periphery of a rear surface of the sealing member 12, the leads 18 are arranged in an exposed manner for external connection.

Even the QFN 15 of such a structure can be applied to the semiconductor device of the first embodiment by mounting the passive component 5 such as a capacitor, a resistor, an inductor, etc. being laid across the leads 18 spaced from each other and by jointing the external terminals 5b of the passive component 5 to respective leads 18 through the jointing materials 13 such as solder or a conductive resin adhesive.

Next, the package structure of the passive component 5 to be incorporated into the semiconductor package 1 of the first embodiment will be described.

First, with reference to FIGS. 9 and 10, a structure of the lead on which the passive component 5 is mounted will be explained. As shown in FIGS. 9 and 10, in the first electrode part 6b of the first plate-like lead 6 to be electrically coupled to the external terminal 5b (see FIG. 8) of one end of the passive component 5, a first through hole (a first concave portion) 6c is formed. In the second electrode part 7b of the second plate-like lead 7 to be electrically coupled to the external terminal 5b of the other end of the passive component 5, a second through hole (a second concave portion) 7c is formed. Moreover, the first plate-like lead 6 and the second plate-like lead 7 are spaced from each other. In addition, a portion from which part of the plate-like lead is extracted (except a gap between the plate-like leads) such as the first through hole 6c and the second through hole 7c is also calls a slit. (The slit passes through from an upper surface to a rear surface of the lead). The sealing resin fills the gap or the first through hole 6c and the second through hole 7c, and part of the sealing member 12 is provided there.

That is, at the first plate-like lead 6, when the first through hole 6c is formed at a generally central portion of the first electrode part 6b thereof along the direction in which the passive component 5 is mounted, the first electrode part 6b is divided into two. Also, at the second plate-like lead 7, when the second through hole 7c is formed at a generally central portion of the second electrode part 7b along the direction in which the passive component 5 is mounted, the second electrode part 7b is divided into two.

The portions of the first through hole 6c and the second through hole 7c do not necessarily have to pass through but may be concave portions. However, it is desirable that they are through holes passing through from the upper surface to the rear surface of the lead.

Of the package structures as shown in FIG. 4, the one without the passive component 5 is shown in FIG. 9. Also, FIG. 10 is a sectional view showing an example of the structure in which the plate-like lead of FIG. 9 is cut at a central portion. As shown in FIGS. 9 and 10, in the first electrode part 6d of the first plate-like lead 6 and the second electrode part 7b of the second plate-like lead 7 divided into four regions, a third concave portion 6d and a fourth concave portion 7d, which are recessed in the thickness direction of the lead and are also called notched portions, are formed respectively. That is, in the corner portions of the first electrode part 6b of the first plate-like lead 6 and the second electrode part 7b of the second plate-like lead 7, the third concave portion 6d and the fourth concave portion 7d are formed, respectively. In other words, at positions to which the first plate-like lead 6 and the second plate-like lead 7 are opposed, the third concave portion 6d is formed on the side of the first plate-like lead 6 and the fourth concave portion 7d is formed on the side of the second plate-like lead 7, respectively. Near the central portions of the third and fourth concave portions 6d and 7d, there are formed the first through hole 6c passing through the first plate-like lead 6 and the second through hole 7c passing through the second plate-like lead 7.

As shown in FIGS. 4, 7, and 8, the passive component 5 is coupled to the two third concave portions 6d and two fourth concave portions 7d using the jointing materials 13 and supported. The passive component 5 includes, for example, a capacitive element. The first plate-like lead 6 and the second plate-like lead 7 are joined through capacitive coupling.

Further, even when the first and second concave portions 6c and 7c are not through holes, the third and fourth concave portions 6d and 7d are respectively shallower than the first and second concave portions 6c and 7c. In other words, the first and second concave portions 6c and 7c are respectively deeper than the third and fourth concave portions 6d and 7d.

Moreover, the third and fourth concave portions 6d and 7d are formed, for example, by half etching. That is, for example, when the thickness of the plate-like lead is 0.2 mm, the depth of the third and fourth concave portions 6d and 7d formed by the half etching is 0.1 mm. By the third and fourth concave portions 6d and 7d, the joint area of the jointing material 13 can be increased and the joining strength of the plate-like lead and the passive component can be raised.

The passive component 5 is mounted on the first and second plate-like leads 6 and 7 having such shapes. FIGS. 4 to 8 show the package structure of the passive component 5 in the semiconductor package 1.

That is, as shown in FIG. 7, at the first electrode part 6b of the first plate-like lead 6, the one external terminals 5b of the passive component 5 are coupled to the first electrode parts 6b on both sides of the first through hole 6c being laid across the first through hole 6c. Similarly, at the second electrode part 7b of the second plate-like lead 7, the other external terminals 5b of the passive component 5 are coupled to the second electrode parts 7b on both sides of the second through hole 7c being laid across the second through hole 7c.

Thereby, as shown in the P region of FIG. 4, at the four corner portions, each of the outer terminals 5b of the passive component 5 is coupled to either the first electrode part 6b of the first plate-like lead 6 or the second electrode part 7b of the second plate-like lead 7 using the jointing material 13 such as solder, a conductive resin adhesive, or the like.

That is, the passive component 5 has a four-point support package structure in which the component is supported by four electrode parts.

In addition, as shown in FIGS. 4 and 8, the first through hole 6c is formed along the mounting direction of the passive component 5 and with a length such that it is pressed out from the passive component 5 when the passive component is mounted. Also, the second through hole 7c is formed along the mounting direction of the passive component 5 and with a length such that it is pressed out from the passive component 5 when the passive component 5 is mounted. In FIG. 4, the relation between D1 (distance from the gap to the end of the through hole) and D2 (distance from the gap to the end of the passive component) is D1>D2. However, it may not be D1>D2.

Thereby, as shown in FIG. 4, after resin sealing, the region R near the central portion between the external terminals on both sides of the passive component 5 is, as shown in FIG. 6, surrounded by part of the sealing member 12. At the same time, the region near the central portion in a direction orthogonal to it is, as shown in FIG. 5, surrounded by part of the sealing member 12. That is, both at the central portion in the longitudinal direction and at the central portion in the width direction, the passive component 5 has a structure in which the central portions are respectively surrounded by the sealing members 12. Therefore, the difference in thermal expansion of components can be made small, and the thermal stress given to the jointing material 13 such as solder can be reduced.

According to the semiconductor package 1 of the first embodiment, the first through hole 6c is formed in the first electrode part 6b of the first plate-like lead 6 and the second through hole 7c is formed in the second electrode part 7b of the second plate-like lead 7. This realizes the structure in which, at the first electrode part 6b of the first plate-like lead 6, the one external terminals 5b of the passive component 5 are coupled to the first electrode parts 6b on both sides of the first through hole 6c while being laid across the first through hole 6c. Furthermore, the above achieves the structure in which, at the second electrode part 7b of the second plate-like lead 7, the other external terminals 5b of the passive component 5 are coupled, being laid across the second through hole 7c, to the second electrode parts 7b on both sides thereof.

Accordingly, at the central portion in both the longitudinal and width directions of the passive component 5, the passive component 5 is surrounded by the sealing members 12. With this structure, the lead made of an alloy of copper is not disposed at the cross sections of the central portions in both the longitudinal and width directions of the passive component 5. Since the materials employed there are a mould resin and a ceramic material, the difference in thermal expansion of the components can be made small, and the thermal stress given to the jointing materials 13 such as solder can be reduced. In addition, the thermal expansion coefficient of the epoxy mould resin is about 15 ppm/k and that of the ceramics is about 5 ppm/k. However, the thermal expansion coefficient is not limited to these.

Moreover, because of the first through hole 6c and the second through hole 7c, the joined area between the passive component 5 and the plate-like lead having different thermal expansion coefficients becomes small, and the thermal stress resulting from the difference in thermal expansion can be reduced.

Also, as for corners, each of the external terminals 5b of the passive component 5 is coupled, using the jointing material 13, to either the first electrode part 6b of the first plate-like lead 6 or the second electrode part 7b of the second plate-like lead 7. As a result, the thermal stress given to the jointing material 13 can be distributed to four regions.

Therefore, the reduction in the stress and reinforcement in strength near the joint between the passive component 5 and the plate-like lead can be attained. Further, the life of the jointing material until its fracture is improved. Still further, the exfoliation of the joined interfaces can be prevented, and the joint reliability of the passive component 5 can be raised. As a result, the reliability of the semiconductor package 1 (semiconductor device) can be improved.

Moreover, the first through hole 6c and the second through hole 7c are filled with the sealing resin and the periphery of the passive component 5 is restrained, which makes it possible to maintain a firm joined state.

Moreover, in the case where the conductive resin adhesive is used as the jointing material 13 and when an occurrence of an out gas at the time of curing of the adhesive resin exerts influence, the out gas produced during the curing of the resin adhesive can easily be discharged, and void generation can be suppressed by use of the first and second through holes 6c and 7c.

Moreover, at the four corners, each of the external terminals 5b of the passive component 5 is coupled, using the jointing material 13, to either the first electrode part 6b of the first plate-like lead 6 or the second electrode part 7b of the second plate-like lead 7. Therefore, the stabilization during the assembly can be attained. That is, the passive component 5 is supported at four points. Therefore, the supporting form is stabilized, and the stabilization during the assembly can be attained.

Further, in the case where the third and fourth concave portions 6d and 7d are formed in the first electrode part 6b of the first plate-like lead 6 and the second electrode part 7b of the second plate-like lead 7, the package height at the time of mounting the passive component 5 can be kept low.

In addition, the first and second through holes 6c and 7c of the first embodiment may be formed on either one of the plate-like leads. Also in this case, as compared to the case where the plate-like lead is without the first and second through holed 6c and 7c, the portion of the passive component 5 surrounded by the sealing members 12 increases. Therefore, the thermal stress given to the jointing material 13 such as solder can be reduced.

Moreover, as shown in FIG. 13, as for the shapes of the first and second through holes 6c and 7c, one end of each through hole may not be joined to the gap between the plate-like leads. Also in this case, as compared to the case where the plate-like lead is without the first and second through holes 6c and 7c, the portion of the passive component 5 surrounded by the sealing members 12 increases. Therefore, the thermal stress given to the jointing material 13 such as solder can be reduced.

Next, with reference to FIGS. 14 and 15, a manufacturing method of the semiconductor package 1 of the first embodiment will be explained.

FIG. 14 shows the manufacturing method of a lead frame used for assembly of the semiconductor package 1. First, as shown in step S1, a copper-alloy frame is prepared. That is, a plate-like frame made of an alloy of copper is prepared.

Then, as shown in step S2, outward shaping of the lead frame is performed. In this regard, the outward shape of the lead frame is formed by etching or stamping.

After that, as shown in step S3, a concave portion is formed. In this regard, the concave portion of the lead frame is formed by etching or stamping.

Thus, as shown in step S4, the lead frame is completed.

In assembling the semiconductor package 1, as shown in step S1 of FIG. 15, a lead frame is prepared. In this regard, the lead frame of the copper alloy produced in steps S1 to S4 is prepared.

Subsequently, as shown in step S12, jointing materials are applied. In this regard, the jointing materials 13 such as solder or a conductive resin adhesive are applied to the first electrode part 6b and a chip mounting part of the first plate-like lead 6, the second electrode part 7b of the second plate-like lead 7, a chip mounting part of the third plate-like lead 8, and a chip mounting part of the fourth plate-like lead 9.

Subsequently, as shown in step S13, the chip is mounted. In this regard, a power MOSFET chip 3 is disposed in the chip mounting part of the first plate-like lead 6 using the jointing material 13. Furthermore, a power MOSFET chip 4 is provided in the chip mounting part of the third plate-like lead 8 using the jointing material 13. Still further, a driver IC chip 2 is provided in the chip mounting part of the fourth plate-like lead 9 using the jointing material 13.

Subsequently, as shown in step S14, components are mounted. In this regard, on the first electrode part 6b of the first plate-like lead 6, the external terminal 5b of one end of the passive component 5 is disposed using the jointing material 13. Also, on the second electrode part 7b of the second plate-like lead 7, the external terminal 5b of the other end of the passive component 5 is disposed using the jointing material 13.

In addition, after the components are mounted as shown in step S14, the chip may be mounted as in step S13. In that case, a place where the chip is mounted in step S13 may differ from a place where the component is mounted in step S14. For example, the chip may be mounted in another factory.

Subsequently, as shown in step S15, the jointing materials are cured. In this regard, each jointing material 13 is cured by performing bake treatment collectively. That is, by use of the jointing materials 13, the power MOSFET chip 3, the power MOSFET chip 4, the driver IC chip 2, and the passive component 5 are joined to respective plate-like leads.

Subsequently, as shown in step S16, wire bonding is performed. In this regard, a pad 2a of the driver IC chip 2 is electrically coupled to a pad 3a of the power MOSFET chip 3 by a wire 10. Also, the pad 2a of the driver IC chip 2 is electrically coupled to a pad 4a of the power MOSFET chip 4 by the wire 10.

Subsequently, joining by use of clips shown in step S17 is performed. In this regard, the pad 3a of the power MOSFET chip 3 is electrically coupled to the third plate-like lead 8 by use of a clip 11a. At the same time, the pad 4a of the power MOSFET chip 4 is electrically coupled to the second plate-like lead 7 by use of a clip 11b.

Subsequently, as shown in step S18, sealing member formation, separation, and removal are performed. In this regard, by use of a seal resin, the power MOSFET chip 3, the power MOSFET chip 4, the driver IC chip 2, and the passive component 5 are sealed with the resin. That is, the sealing member 12 is formed by use of the seal resin. Then, each chip and the passive component 5 are sealed with the resin.

After that, separation and removal by turning parts into pieces is performed, and the assembly of semiconductor package 1 is completed.

Second Embodiment

Figure 11:
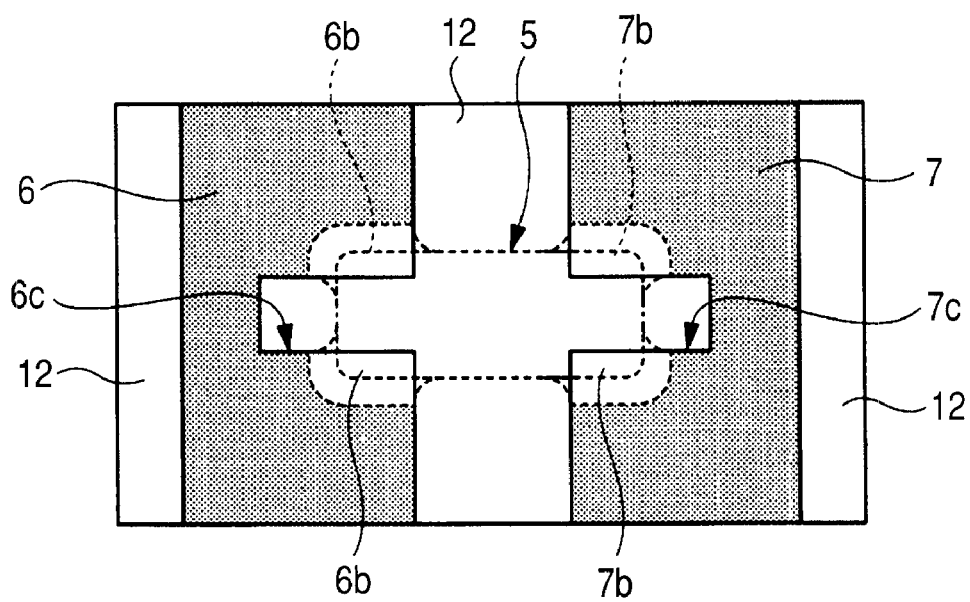
FIG. 11 is a plan view showing a structure of the first and second plate-like leads of a modification of the structure shown in FIG. 4.
Figure 12:
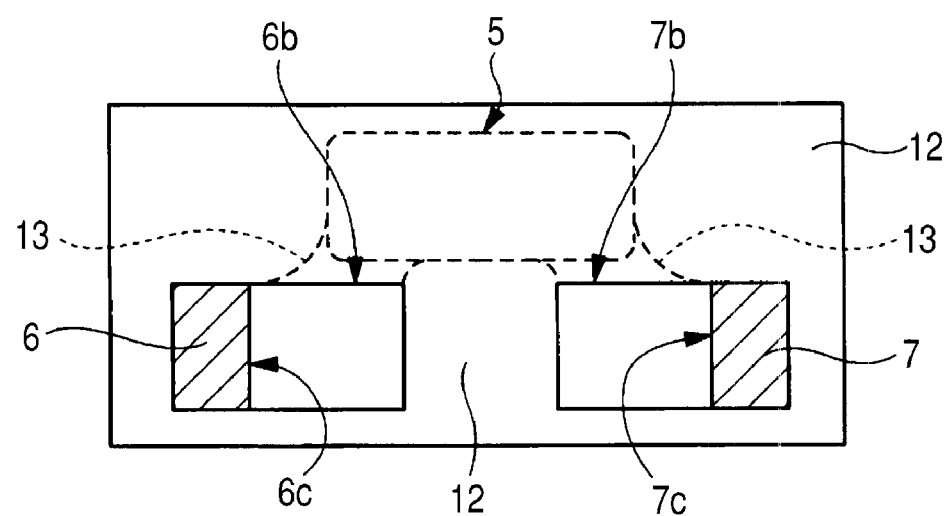
FIG. 12 is a sectional view showing a structure in which the plate-like lead of FIG. 11 is cut at its central portion.

FIG. 11 is a plan view showing structures of the first and second plate-like leads of a modification of the structure shown in FIG. 4. FIG. 12 is a sectional view showing a structure in which the plate-like lead shown in FIG. 11 is cut at its central portion.

In addition, FIGS. 11 and 12 show shapes of the lead of the modification of the four-point support package structure, namely, the electrode structure in which a concave portion is not formed in each electrode part. That is, the first electrode part 6b of the first plate-like lead 6 and the second electrode part 7b of the second plate-like lead 7 respectively have flat electrode structures.

However, even in the lead shapes shown in FIGS. 11 and 12, at the four corners, each external terminal 5b (see FIG. 8) of the passive component 5 is coupled to either the first electrode part 6b of the first plate-like lead 6 or the second electrode part 7b of the second plate-like lead 7 using the jointing material 13 such as solder, a conductive resin adhesive, or the like. Therefore, also in this case, the passive component 5 has the four-point support package structure in which the passive component 5 is supported by four electrodes. In this case, a step to form the concave portion is not necessary, reducing the number of manufacturing processes.

Moreover, when there is no concave portion, the shapes of the first electrode part 6b of the first plate-like lead 6 and the second electrode part 7b of the second plate-like lead 7 can be made flat, and the lead shapes can be formed easily.

Third Embodiment

Figure 16:
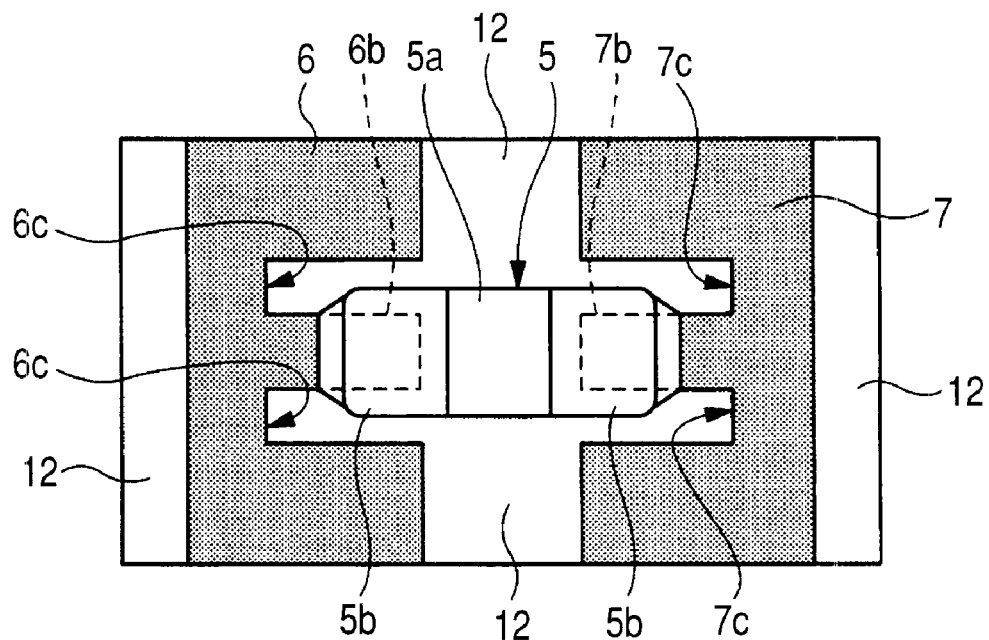
FIG. 16 is a plan view showing a structure of a third embodiment, which is a modification of the structure of FIG. 4, according to the present invention.

Now, the package structure of the passive component of a modification of the first embodiment shown in FIGS. 16 to 19 in which the passive component is supported at two points will be explained. FIG. 16 is a plan view showing a structure of a modification of the structure shown in FIG. 4, FIG. 17 is a sectional view showing a structure in which the structure shown in FIG. 16 is cut at its central portion, FIG. 18 is a plan view showing examples of the first and second plate-like leads of the structure shown in FIG. 16, and FIG. 19 is a sectional view showing an example of the structure in which the plate-like lead shown in FIG. 18 is cut at its the central portion.

Figure 17:
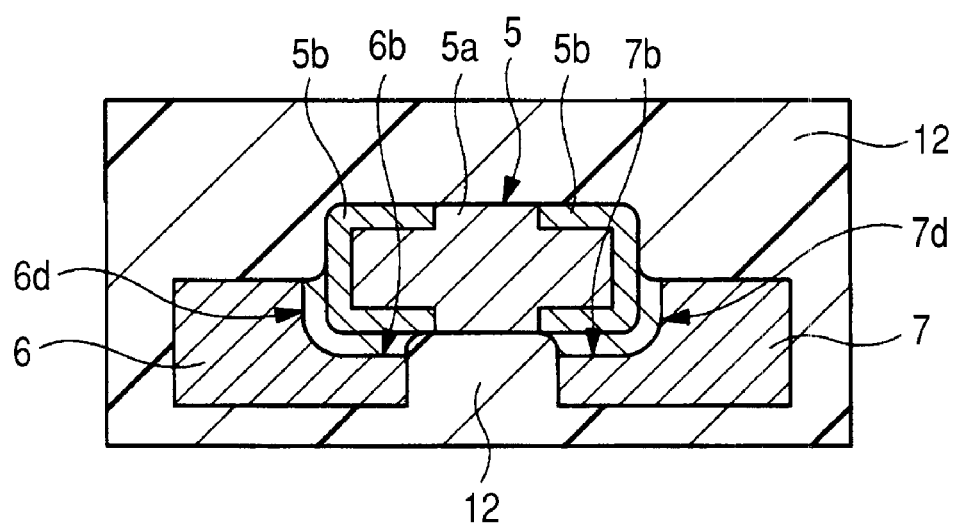
FIG. 17 is a sectional view showing a structure in which the structure shown in FIG. 16 is cut at its central portion.
Figure 18:
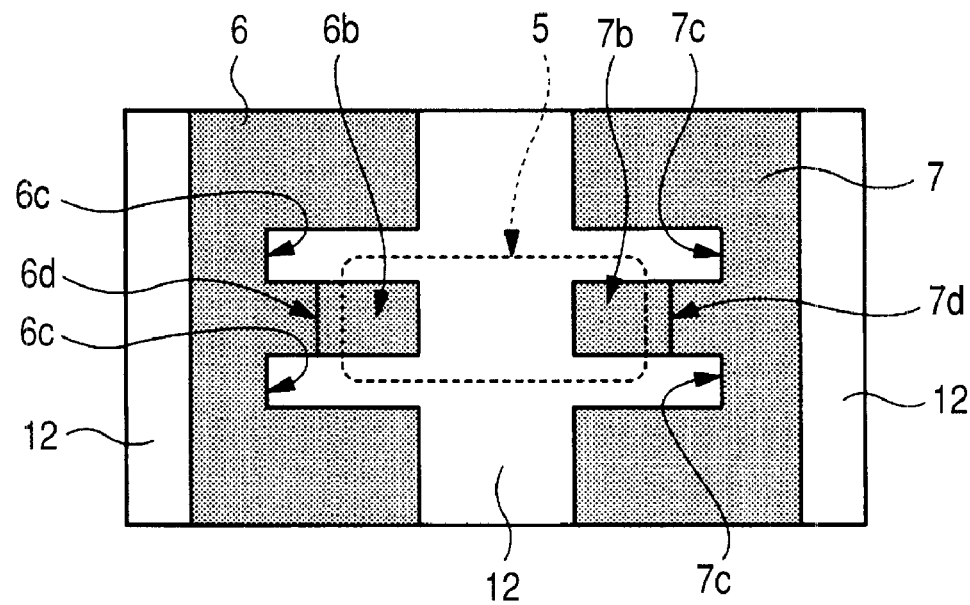
FIG. 18 is a plan view showing an example of the structure of the first and second leads of the structure of FIG. 16.
Figure 19:
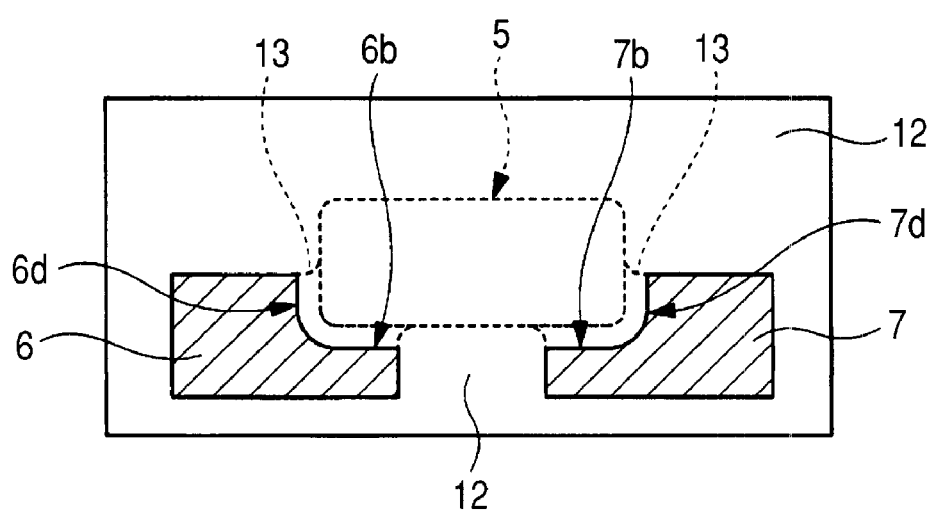
FIG. 19 is a sectional view showing an example of the structure in which the plate-like lead of FIG. 18 is cut at its central portion.

The package structures of the passive components 5 shown in FIGS. 16 and 17 are the ones using the first and second plate-like leads 6 and 7 of the lead shapes shown in FIGS. 18 and 19. As shown in FIGS. 18 and 19, in the first plate-like lead 6, a pair of first through hole 6c are so provided along the longitudinal direction of the passive component 5 to be mounted as to sandwich the first electrode part 6b. In the second plate-like lead 7 also, a pair of second through holes 7c are so provided along the longitudinal direction of the passive component 5 to be mounted as to sandwich the second electrode part 7b.

As shown in FIGS. 16 and 17, when the passive component 5 is mounted on the first electrode part 6b and the second electrode part 7b, at the first electrode part 6b, one external terminal 5b of the passive component 5 is coupled to the first electrode part 6b, while being laid across the pair of first through holes 6c. Furthermore, at the second electrode part 7b, the other external terminal 5b of the passive component 5 is coupled to the second electrode part 7b while being laid across the pair of second through holes 7c.

For example, in FIG. 16, when the passive component 5 is mounted, the first and second through holes 6c and 7c are so formed that the side surface along the longitudinal direction of the passive component 5 may be disposed over the first and second through holes 6c and 7c. In addition, the first and second through holes 6c and 7c are so formed that the side surface along the longitudinal direction of the passive component 5 may be disposed while being laid across the first and second through holes 6c and 7c.

Moreover, the length of the first through hole 6c is so defined along the mounting direction of the passive component 5 as to be pressed out of the passive component 5 when it is mounted. Also, the length of the second through hole 7c is so defined along the mounting direction of the passive component 5 as to be pressed out of the passive component 5 when it is mounted.

In addition, the passive component 5 shown in FIGS. 16 and 17 are supported by the one first electrode part 6b and one second electrode part 7b, which is a two-point support package structure. Therefore, after the resin sealing, a region between the external terminals 5b on both sides of the passive component 5 is surrounded by part of the sealing member 12.

Thus, as shown in FIGS. 16 and 17, because of the supporting form of the passive component 5, the positional relation with the first through hole 6c, and the positional relation with the second through hole 7c, the passive component 5 has the structure in which, after the resin sealing, the side surface, upper surface, and the central portion in the longitudinal direction of the rear surface are surrounded by the sealing member 12.

As a result, in the case where a conductive resin adhesive is used as the jointing material 13, by use of the respective first and second through holes 6c and 7c, the out gas at the time of curing the resin adhesive can be discharged easily, and the void generation can be suppressed.

Moreover, as shown in FIG. 19, in the first electrode part 6b of the first plate-like lead 6 and the second electrode part 7b of the second plate-like lead 7, third and fourth concave portions 6d and 7d respectively recessed in the thickness direction of the lead are formed. That is, in the first electrode part 6b of the first plate-like lead 6 and the second electrode part 7b of the second plate-like lead 7, there are formed the third and fourth concave portions 6d and 7d, respectively. As shown in FIG. 19, the passive component 5 is coupled to the third and fourth concave portions 6d and 7d using the jointing member 13 and supported.

Thus, the package height of the passive component 5 can be made low.

Fourth Embodiment

Figure 20:
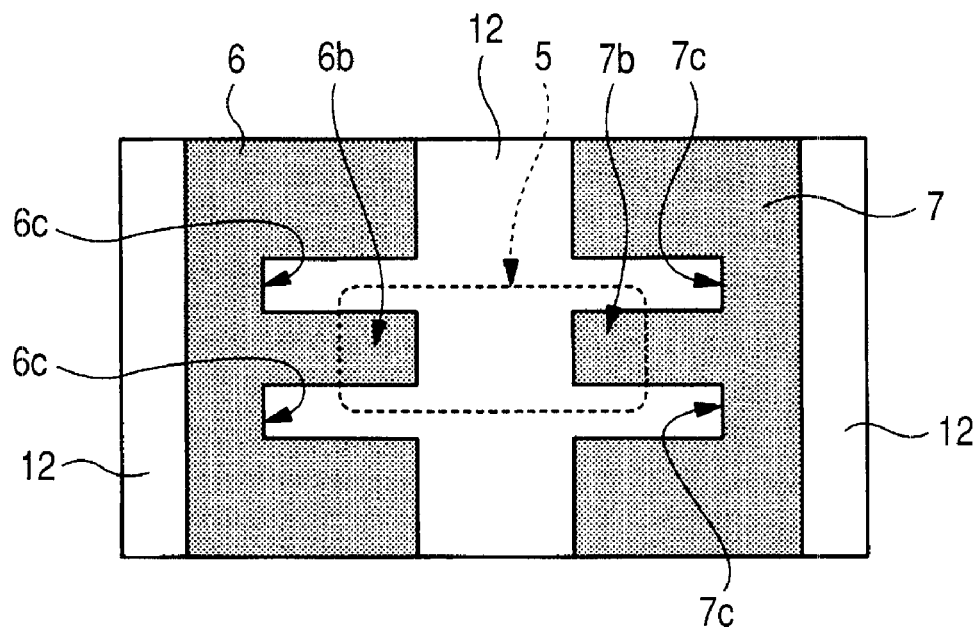
FIG. 20 is a plan view showing a structure of the first and second plate-like leads of modifications of the structure of FIG. 16.
Figure 21:
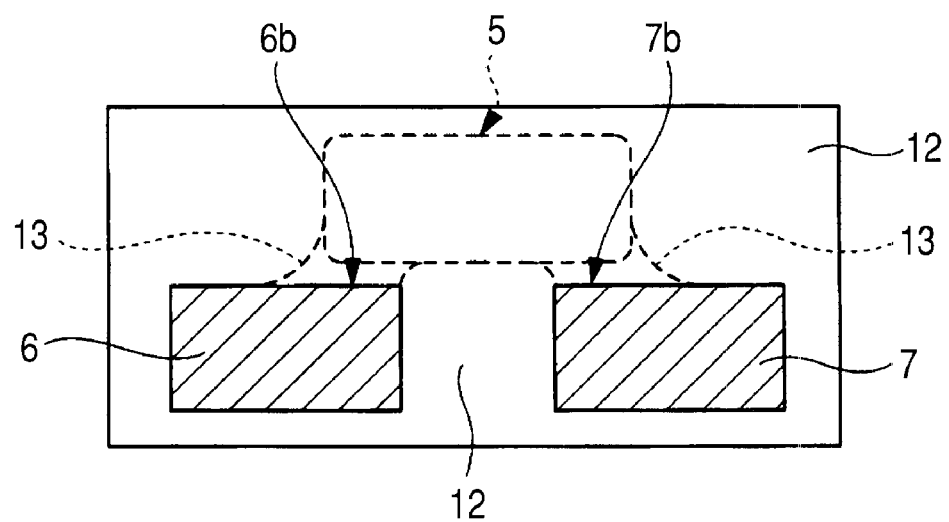
FIG. 21 is a sectional view showing a structure in which the plate-like lead of FIG. 20 is cut at its central portion.

FIG. 20 is a plan view showing structures of the first and second plate-like leads of the modification of the structure of FIG. 16. FIG. 21 is a sectional view showing a structure in which the plate-like lead shown in FIG. 20 is cut at its central portion.

In the modifications shown in FIGS. 20 and 21, shapes of the first electrode part 6b of the first plate-like lead 6 and the second electrode part 7b of the second plate-like lead 7 are flat. As shown in FIGS. 20 and 21, by allowing the shapes of the first electrode part 6b of the first plate-like lead 6 and the second electrode part 7b of the second plate-like lead 7 to be flat, the shapes of the leads can be formed easily.

Fifth Embodiment

Figure 22:
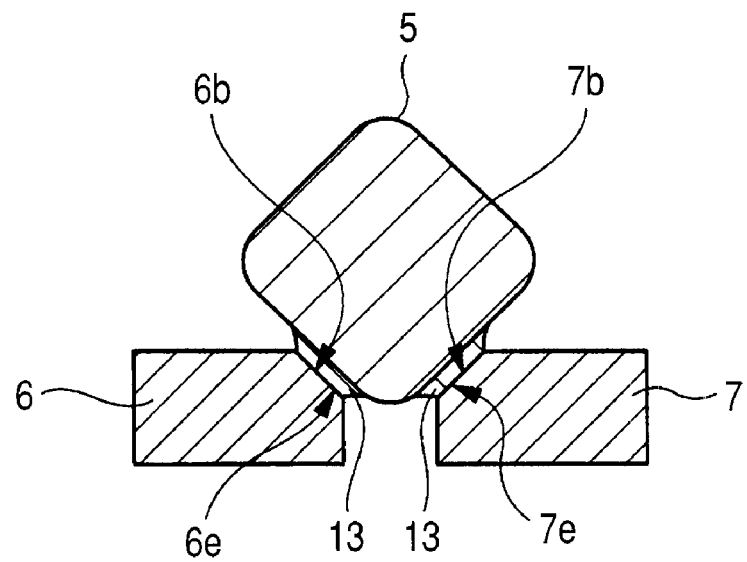
FIG. 22 is a sectional view showing a structure of the first and second plate-like leads of a fifth embodiment of the present invention.
Figure 23:
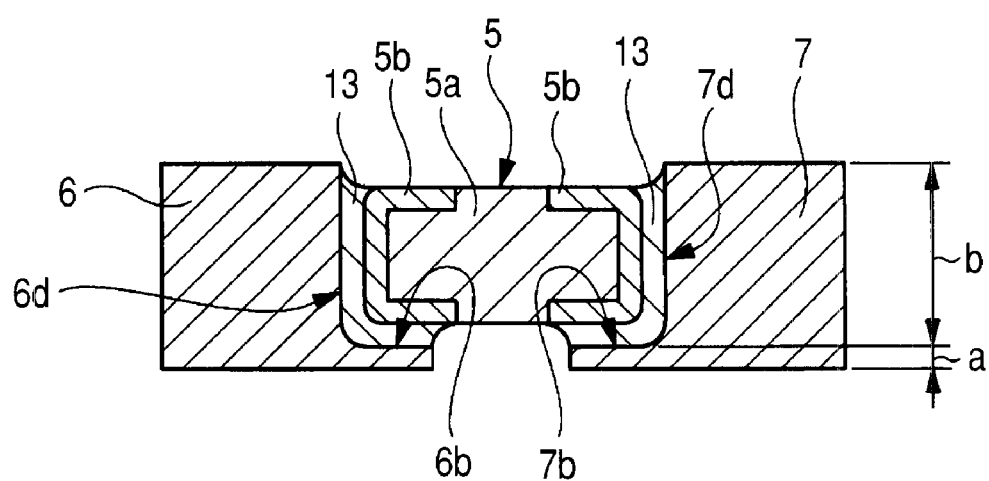
FIG. 23 is a sectional view showing a structure of the first and second plate-like leads of the fifth embodiment of the present invention.
Figure 24:
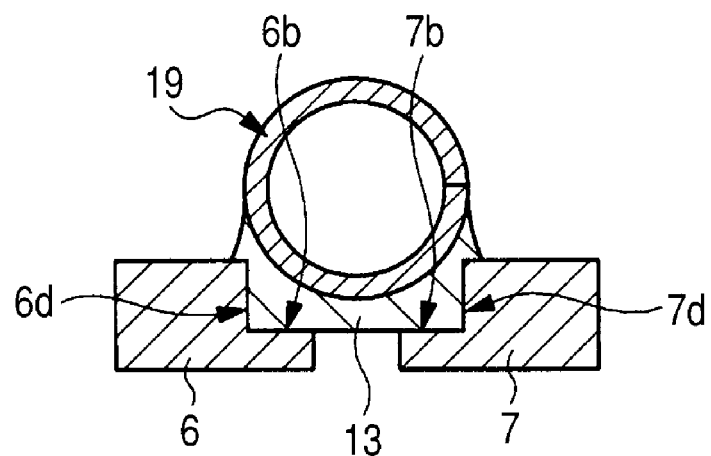
FIG. 24 is a sectional view showing a first example of a structure in which air core coils being modifications of a passive component are mounted on the first and second plate-like leads of the first and third embodiments according to the present invention.
Figure 25:
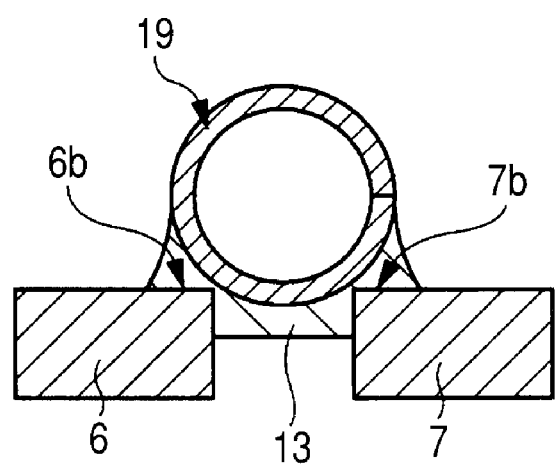
FIG. 25 is a sectional view showing a second example of the structure in which air core coils being modifications of the passive component are mounted on the first and second plate-like leads of the first and third embodiments according to the present invention.
Figure 26:
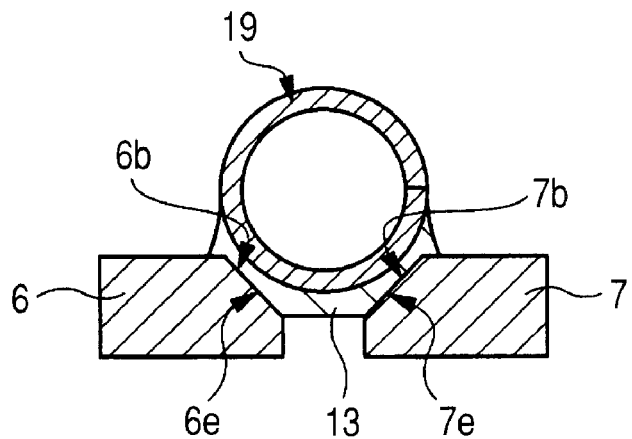
FIG. 26 is a sectional view showing a third example of the structure in which air core coils being modifications of the passive component are mounted on the first and second plate-like leads of the first and third embodiments according to the present invention.

Now, the lead shape of the modification of the first and third embodiments and the passive component of the modification shown in FIGS. 22 to 26 will be explained. FIG. 22 is a sectional view showing the structures of the first and second plate-like leads of the modification of the first and third embodiments according to the present invention. FIG. 23 is a sectional view showing the structure of the first and second plate-like leads of the modification of the first and third embodiments according to the present invention. Furthermore, FIG. 24 is a sectional view showing a first example of a structure when air core coils which are modifications of the passive component are mounted on the first and second plate-like leads of the first to third embodiments according to the present invention. FIG. 25 is a sectional view showing a second example of the structure when air core coils which are modifications of the passive component are mounted on the first and second plate-like leads of the first and third embodiments according to the present invention. FIG. 26 is a sectional view showing a third example of the structure when air core coils which are modifications of the passive component are mounted on the first and second plate-like leads of the first and third embodiments according to the present invention.

The plate-like lead of the modification shown in FIG. 22 is the one in which taper portions 6e and 7e are formed at the first electrode part 6b of the first plate-like lead 6 and the second electrode part 7b of the second plate-like lead 7, respectively. In this case, the passive component 5 is rotated by 45 degrees and mounted on the first electrode part 6b of the first plate-like lead 6 and the second electrode part 7b of the second plate-like lead 7.

As a result, the external terminal 5b of the passive component 5 and the taper portions 6e and 7e can be joined surface by surface, achieving the stabilization of the joined state. Furthermore, unsteadiness of the external terminal 5b of the passive component 5 and the taper portions 6e and 7e can be eliminated, making it easier to handle parts during the mounting.

Moreover, the modification shown in FIG. 23 shows the relation between the thickness (a) of a support and the depth (b) of a concave portion in the first and second plate-like leads 6 and 7 in which the third and fourth concave portions 6d and 7d are formed. When (a)<(b), it is possible to drop the passive component 5 into the third and fourth concave portions 6d and 7d. Therefore, a joint area with the jointing material 13 can be increased, and the joining strength of the passive component 5 can be raised.

For example, when the height of the passive component 5 is 0.5 mm, the passive component 5 can be dropped into the third and fourth concave portions 6d and 7d by allowing the thickness of the plate-like lead to be 0.6 mm, (a) to be 0.1 mm, and (b) to be 0.5 mm. However, the thickness of the plate-like lead is not limited to 0.6 mm. Needless to say, it may be about 0.2 mm or may be smaller than these.

Also, the relation between the thickness (a) of the support and the depth (b) of the concave portion may be other than (a)<(b). That is, it may be (a)>(b) or (a)=(b). However, in consideration of improving the joining strength of the passive component 5, (a)<(b) is preferred.

FIG. 24 to 26 show cases in which air core coils 19 are mounted as modifications of the passive component. The modification shown in FIG. 24 is the one in which the air core coils 19 are mounted in the first and second plate-like leads 6 and 7 in which the third and fourth concave portions 6d and 7d are formed. Further, FIG. 25 shows a modification in which air core coils 19 are mounted in the flat first electrode part 6b and the second electrode part 7b in which the third and fourth concave portions 6d and 7d are not formed. Still further, FIG. 26 shows a modification in which the air core coils 19 are mounted in the first and second plate-like leads 6 and 7 in which taper portions 6e and 7e are formed. A diameter of the air core coil 19 may be larger than the height of the chip component. When the air core coil 19 is mounted in the semiconductor package 1, the height of the semiconductor package 1 is often restricted by the coil diameter of the air core coil 19.

Therefore, among the modifications shown FIGS. 24 to 26, the ones where the package height of the air core coil 19 can easily be lowered are the example shown in FIG. 24 in which the third and fourth concave portions 6d and 7d are formed and the example shown in FIG. 26 in which the taper portions 6e and 7s are formed. When the air core coil 19 is mounted on the first and second plate-like leads 6 and 7, the height of the semiconductor package 1 can be made low by forming the third and fourth concave portions 6d and 7d or taper portions 6e and 7e in the first electrode part 6b of the first plate-like lead 6 and the second electrode part 7b of the second plate-like lead 7. On the other hand, in the example in which the third and fourth concave portions 6d and 7d and taper portions 6e and 7e shown in FIG. 25 are not formed, it is not necessary to form the third and forth concave portions 6d and 7d as well as taper portions 6e and 7e. Therefore, the number of manufacturing processes can be reduced.

Sixth Embodiment

Figure 27:
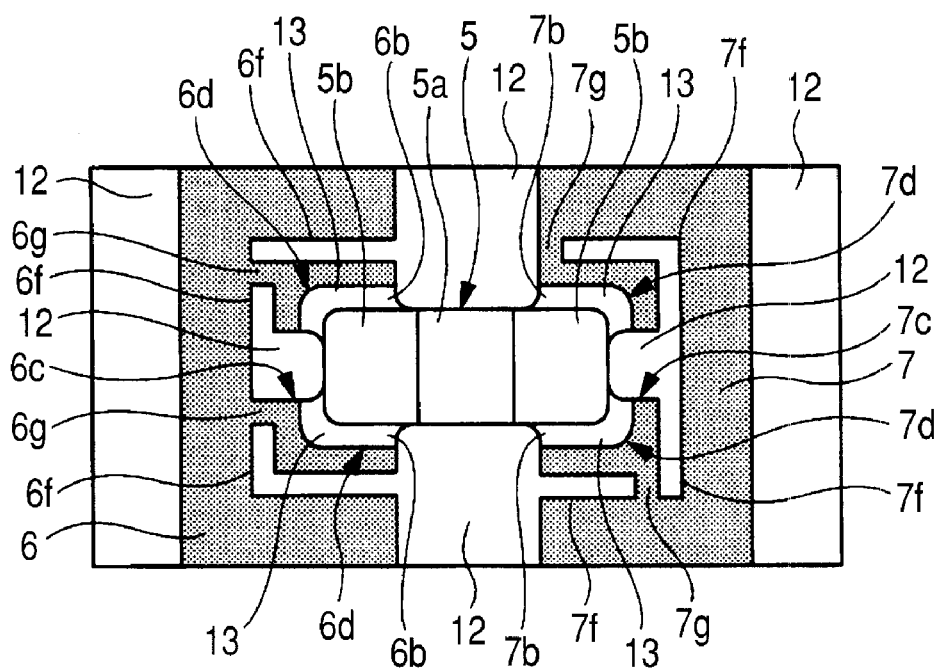
FIG. 27 is a plan view showing an example of a structure in which the passive component is mounted on the first and second plate-like leads of a sixth embodiment according to the present invention.
Figure 28:
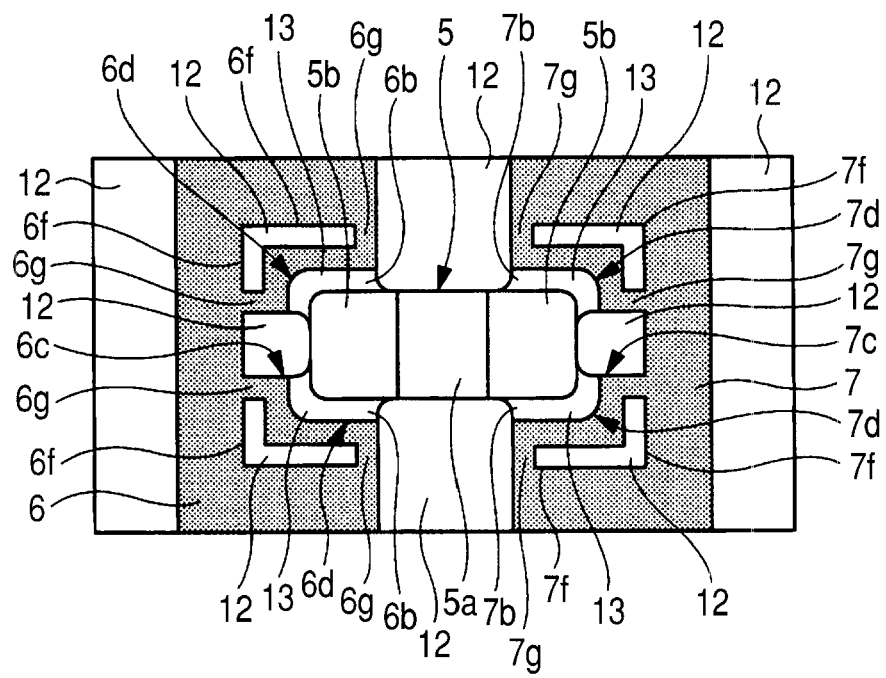
FIG. 28 is a plan view showing a modification of the structure in which the passive component is mounted on the first and second plate-like leads of the sixth embodiment according to the present invention.
Figure 29:
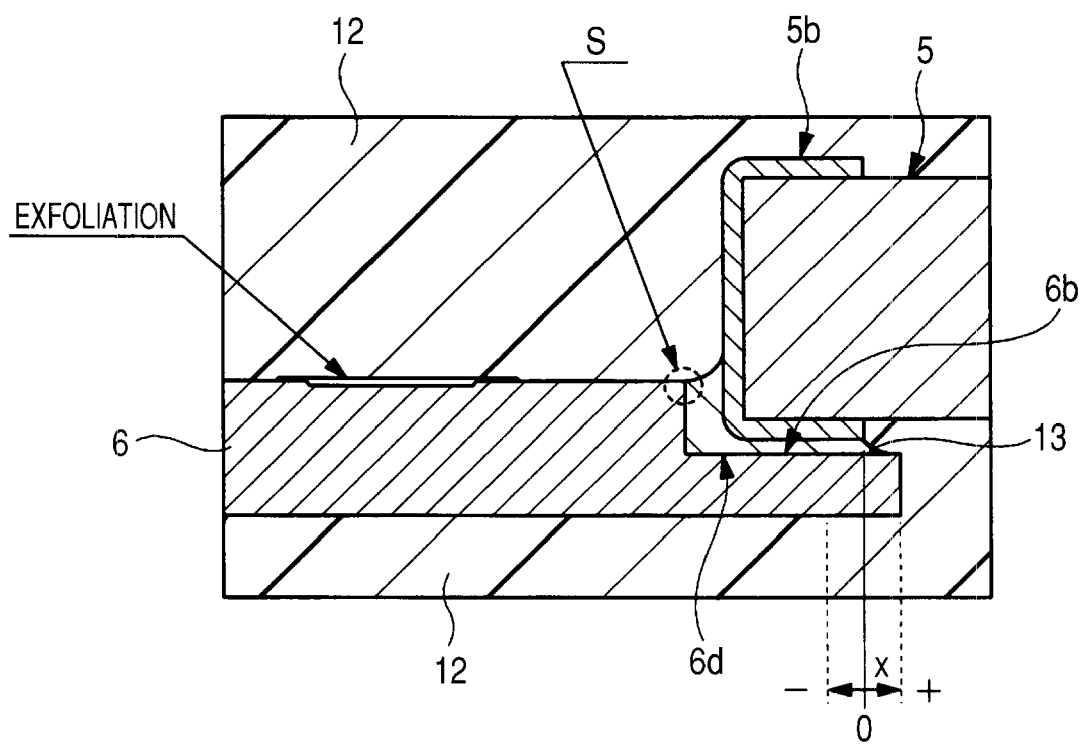
FIG. 29 is a partial sectional view showing an example of a verification structure of a resin/frame interface-end stress at the plate-like lead (without through holes) of a comparative example of the sixth embodiment of the present invention.
Figure 30:
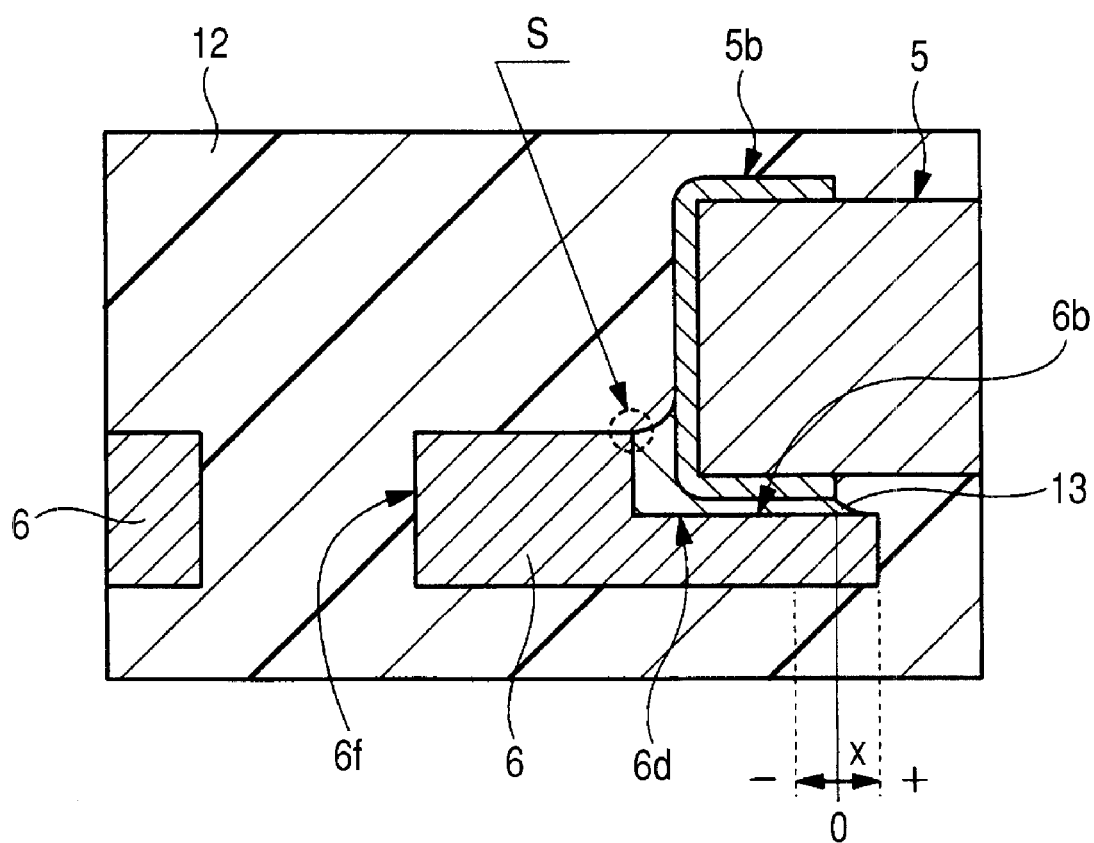
FIG. 30 is a partial sectional view showing an example of a verification structure of a resin/frame interface-end stress of the plate-like lead (with through holes) of the sixth embodiment of the present invention.
Figure 31:
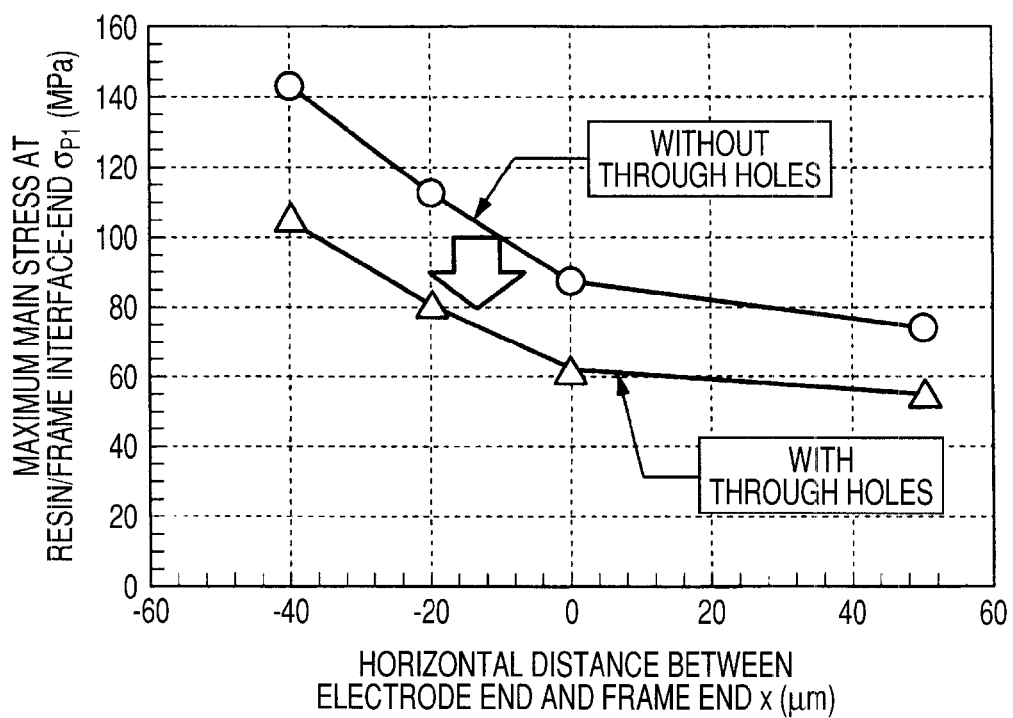
FIG. 31 is a stress comparison chart showing an example of a verification result of the resin/frame interface-end stress of the plate-like lead (with through holes) of the sixth embodiment of the present invention and the plate-like lead (without through holes) of a comparative example.
Figure 32:
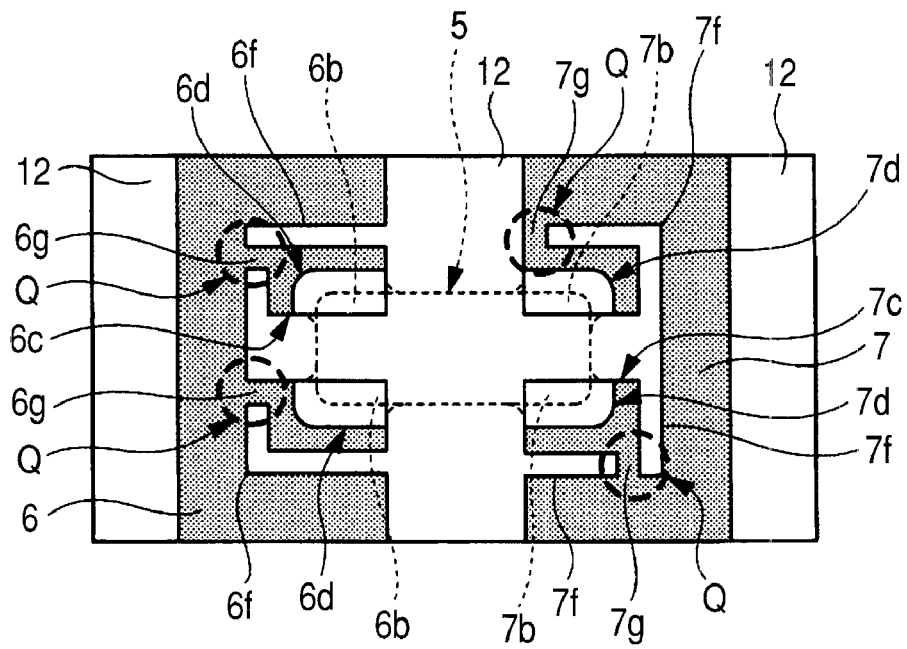
FIG. 32 is a plan view showing an example of a structure of the first and second leads of the structure shown in FIG. 27.
Figure 34:
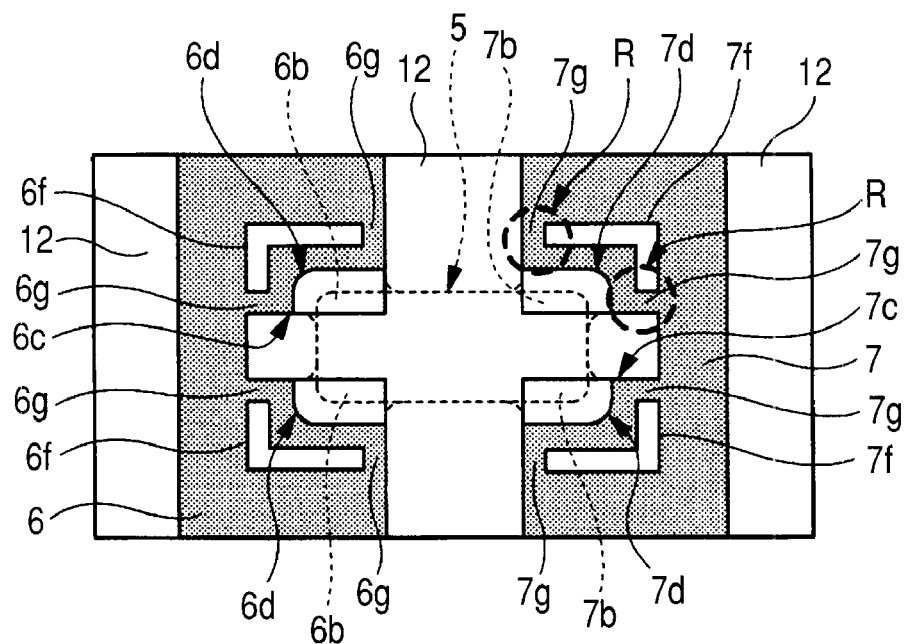
FIG. 34 is a plan view showing an example of structures of the first and second plate-like leads of the structure shown in FIG. 28.

FIG. 27 is a plan view showing an example of the structure in which a passive component is mounted on the first and second plate-like leads of the sixth embodiment according to the present invention. FIG. 28 is a plan view showing a modification of the structure in which the passive component is mounted on the first and second plate-like leads of the sixth embodiment according to the present invention. FIG. 29 is a partial sectional view showing an example of a verification structure of the resin/frame interface end stress in the plate-like lead (without a through hole) of a comparative example of the sixth embodiment according to the present invention. FIG. 30 is a partial sectional view showing an example of the verification structure of the resin/frame interface end stress in the plate-like lead (with a through hole) of the sixth embodiment according to the present invention. FIG. 31 is a stress comparison graph showing a verification result of the resin/frame interface-end stress at the plate-like lead (with a through hole) of the sixth embodiment of the invention and the plate-like lead of the comparative example. Further, FIG. 32 is a plan view showing an example of the structure of the first and second plate-like leads having the structure shown in FIG. 27. FIG. 34 is a plan view showing an example of the structure of the first and second plate-like leads having the structure shown in FIG. 28.

The sixth embodiment depicts a package structure of a lead shape in which through holes are provided around the mounting position (electrode part) of the passive component.

FIG. 27 shows a package structure of the passive component of the sixth embodiment. It is the package structure using the first and second plate-like lead 6 and 7 shown in FIG. 32. Now, the shapes of the first and second plate-like leads 6 and 7 shown in FIG. 32 will be described. Around the first electrode part 6b of the first plate-like lead 6, a through hole (a fifth concave portion) 6f is formed. At the same time, around the second electrode part 7b of the second plate-like lead 7, a through hole (a fifth concave portion) 7f is formed.

The lead shape shown in FIG. 32 uses a one-point hanger structure in which the first and second electrode parts 6b and 7b are supported by respective hangers 6g and 7g between the through holes. That is, the first electrode part 6b in the first plate-like lead 6 is supported by one hanger part 6g (Q portion) between the neighboring through holes 6f. On the other hand, the second electrode part 7b in the second plate-like lead 7 is supported by a hanger part 7g (Q portion) between the neighboring through holes 7f or by one hanger part 7g (Q portion) provided arranged at the end portion. That is, each electrode part is supported by one-point hanger structure.

In the first and second electrode parts 6b and 7b, the third and fourth concave portions 6d and 7d are formed, respectively.

Therefore, the lead shape shown in FIG. 32 is such that it has a concave portion in the electrode part and that the electrode part is supported by one-point hanger structure.

Moreover, the widths of the through holes 6f and 7f are narrower than widths of the first and second through holes 6c and 7c and, also, narrower than a space between the first and second plate-like leads 6 and 7. Further, the through holes 6f and 7f are so disposed and formed as to surround the mounted passive component 5.

As described above, the through holes 6f and 7f are provided around the mounted passive component 5 and, preferably, surrounding the mounted passive component 5. Therefore, in the package structure of the passive component 5 shown in FIG. 27, the lead rigidity of the component mounting part can be made low. As a result, at the first and second electrode parts 6b and 7b, thermal stress applied to the jointing material 13 can be reduced. Thus, the progress of exfoliation at the interface between each lead and the jointing material 13 and the interface between each lead and the sealing member 12 can be suppressed.

Moreover, the central portions in the longitudinal and width directions of the passive component 5 and through holes 6f and 7f are filled with a mould resin. Therefore, the periphery of the passive component 5 can be restrained by part of the sealing member 12. As a result, the firm joined state between the passive component 5 and each lead can be maintained.

With reference to FIGS. 29 to 31, a description is made to a result of simulation of variation of the stress at the resin (sealing member 12) and the end portion (S region) of the lead interface between the case (FIG. 30) where there are through holes around the passive component 5 and the case (FIG. 29) where there is no through hole. A horizontal axis of the simulation result shown in FIG. 31 is such that, assuming an electrode end of the passive component 5 in FIGS. 29 and 30 as a 0 (zero) point, the distance (x) from the 0 point to the lead end is distributed to + and −. The stress value at each spot in S region is shown on a vertical axis for the simulation.

As shown in FIG. 31, regardless of the value on the horizontal axis (x), such a result is obtained that the stress is reduced by about 30% in the case of the one with the through hole as compared to the one without the through hole.

That is, at the first and second plate-like leads 6 and 7, through holes 6f and 7f are formed around the passive component 5. Therefore, at the first and second electrode parts 6b and 7b, the stress applied to the jointing material 13 can be reduced.

The modification shown in FIG. 34 is such that the first and second electrode parts 6b and 7b are supported by two hanger parts 6g and 7g respectively, which a two-point hanger structure. That is, the first electrode part 6b of the first plate-like lead 6 and the second electrode part 7b of the second plate-like lead 7 are respectively supported by two hanger parts 7g (R portion). That is, the electrode parts are supported by the two-point hanger structure.

In the first and second electrode parts 6b and 7b, there are formed the third and fourth concave portions 6d and 7d, respectively. Therefore, the lead shape shown in FIG. 34 is the one in which the electrode part has the concave portion and is supported by the two-point hanger structure.

With the lead shape shown in FIG. 34 also, the stress given to the jointing material 13 can be reduced by forming the through holes 6f and 7f. Moreover, by supporting each electrode part with the two-point hanger structure, supporting strength for each electrode can be raised (enhanced). In addition, the first and second plate-like leads 6 and 7 of the lead shape shown in FIG. 34 is adopted in the package structure of the passive component 5 shown in FIG. 28. In this case, the support strength at each electrode part can be raised, which improves the assembling stability.

Seventh Embodiment

Figure 33:
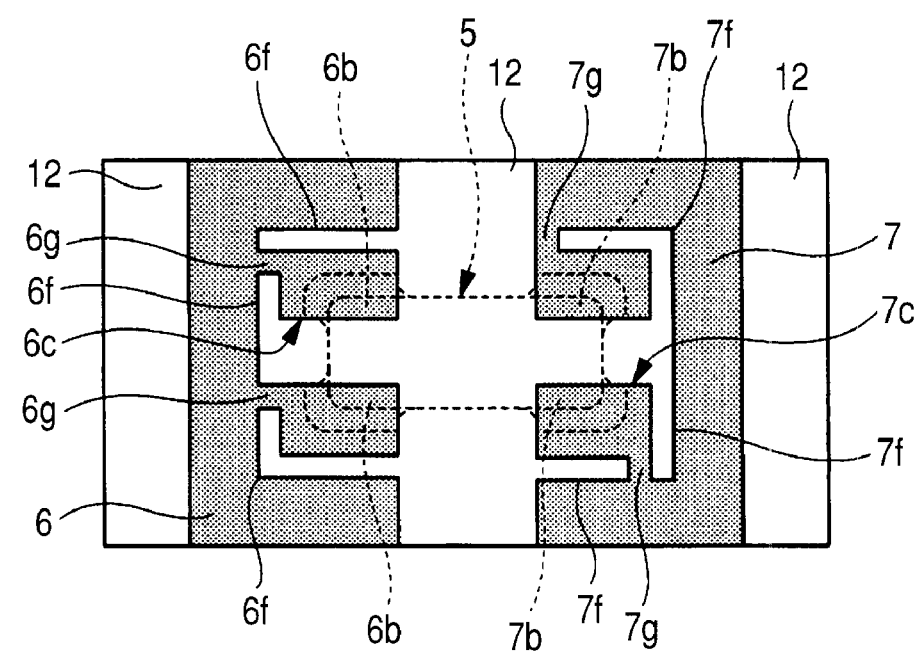
FIG. 33 is a plan view showing a structure of the first and second plate-like leads of a modification of the structure shown in FIG. 27.

FIG. 33 is a plan view showing a structure of the first and second plate-like leads of the modification of the structure shown in FIG. 27. As in FIG. 32, the modification shown in FIG. 33 is the one in which the through holes 6f and 7f are formed around the first and second electrode parts 6b and 7b. At the same time, the electrode part has a flat structure in which concave portions are not formed in the first and second electrode parts 6b and 7b. That is, each of the first and second electrode parts 6b and 7b is supported at one point and has the flat structure. Also in this case, the stress given to the jointing material 13 can be reduced by forming the through holes 6f and 7f. At the same time, the shape of the lead can be formed easily.

Eighth Embodiment

Figure 35:
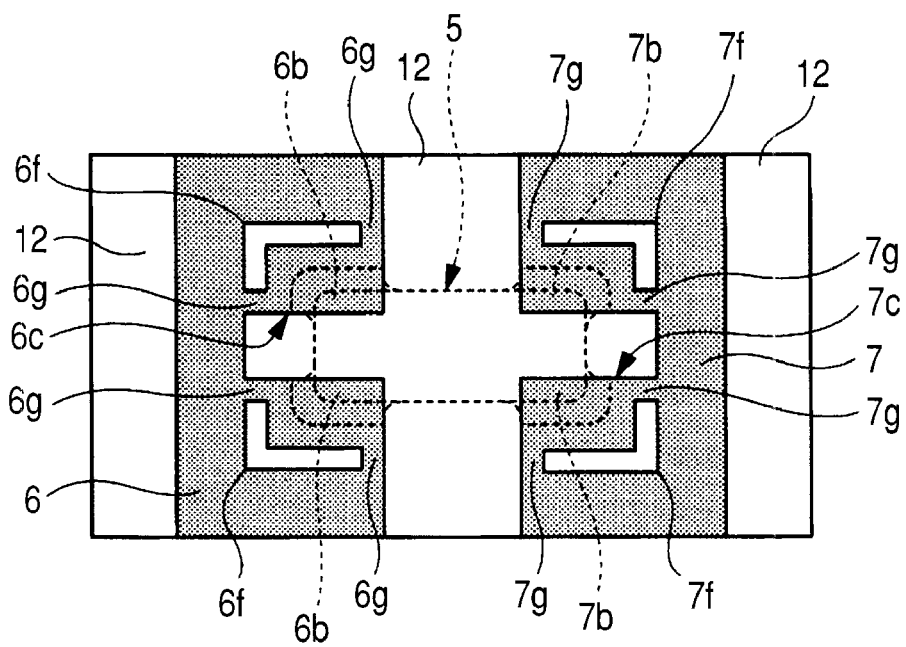
FIG. 35 is a plan view showing a structure of the first and second plate-like leads of a modification of the structure shown in FIG. 28.

FIG. 35 is a plan view showing structures of the first and second plate-like leads which are modifications of the structure shown in FIG. 28. As in FIG. 34, the modification shown in FIG. 35 is the one in which the through holes 6f and 7f are formed around the first and second electrode parts 6b and 7b. At the same time, the electrode part has a flat structure in which the first and second electrode parts 6b and 7b have no concave portion. That is, in the above case, the first and second electrode parts 6b and 7b are supported at two points, and each electrode part has a flat structure. Also in this case, the stress given to the jointing material 13 can be reduced by forming the through holes 6f and 7f. At the same time, the shape of the lead can be formed easily. Furthermore, in the package structure of the passive component 5 using the lead shape shown in FIG. 35, the supporting strength of each electrode part can be raised and the stability in assembly can be improved.

When comparing the one-point support structure of the electrode part shown in FIGS. 32 and 33 with the two-point support structure of the electrode part shown in FIGS. 34 and 35, in terms of stress applied to the jointing material 13, the degree of flexibility of the support state of each electrode is higher than that of the two-point support structure. Therefore, the stress applied to the jointing material 13 can be made lower.

In terms of stability of assembly, the support strength of each electrode part of the two-point support structure is higher than that of the one-point support structure. Therefore, the stability in assembly can be further improved.

Ninth Embodiment

Figure 36:
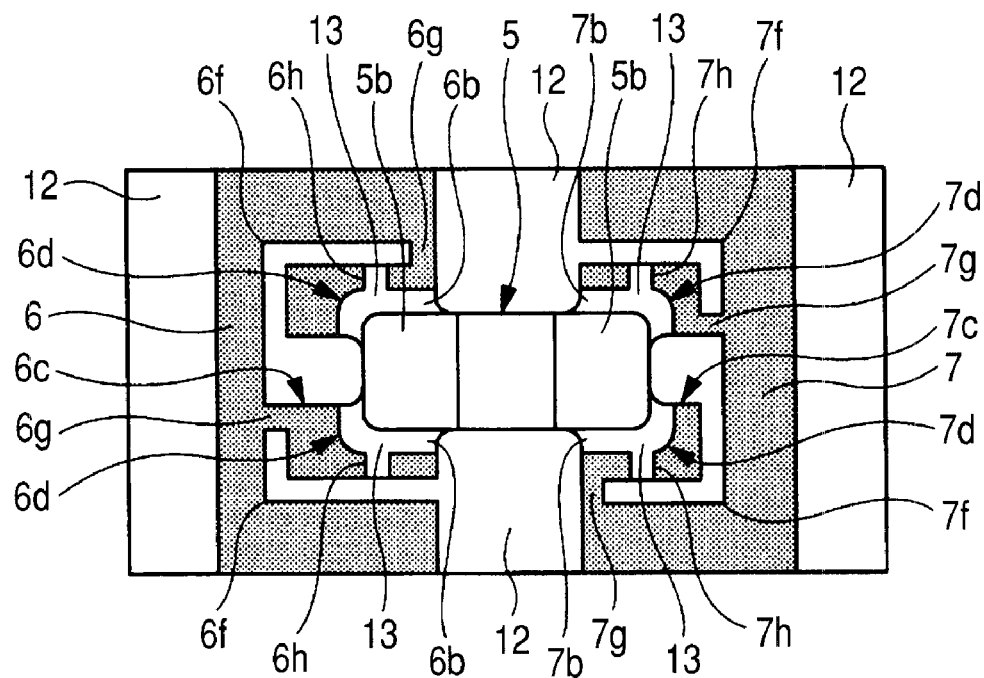
FIG. 36 is a plan view showing an example of a structure in which the passive component is mounted on the first and second plate-like leads (with grooves for discharging gas) of a ninth embodiment of the present invention.
Figure 37:
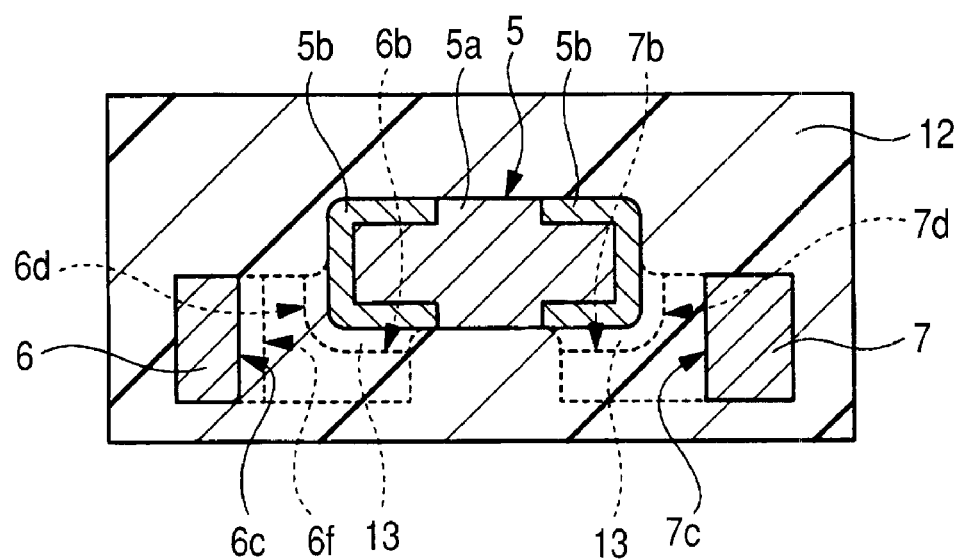
FIG. 37 is a sectional view showing a structure in which the structure of FIG. 36 is cut at its central portion.
Figure 38:
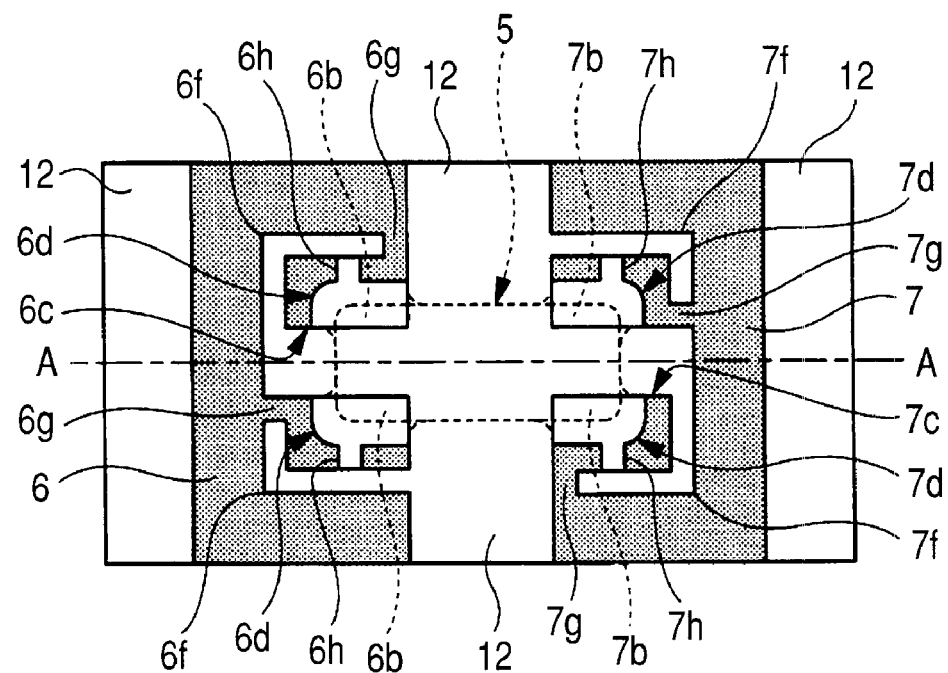
FIG. 38 is a plan view showing an example of a structure of the first and second plate-like leads of the structure shown in FIG. 36.
Figure 39:
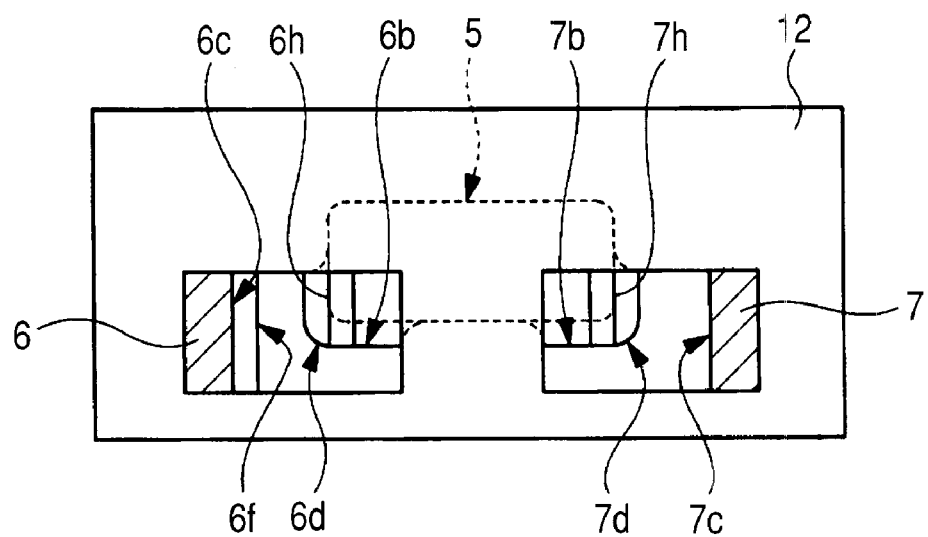
FIG. 39 is a sectional view showing an example of the structure cut along a line A-A in FIG. 38.

FIG. 36 is a plan view showing an example of a structure when the passive component is mounted on the first and second plate-like leads (with groove portions for discharging gas) of a ninth embodiment of the present invention; FIG. 37 is a sectional view showing a structure in which the structure of FIG. 36 is cut at its central portion; FIG. 38 is a plan view showing an example of structures of the first and second plate-like leads of the structure shown in FIG. 36; and FIG. 39 is a sectional view showing an example of the structure cut along a line A-A in FIG. 38.

In the ninth embodiment, in a package structure of the passive components, a description is given made to a discharge structure of an out gas which occurs when baking a jointing material such as solder.

FIGS. 36 and 37 show the package structure of the passive component 5 using the first and second plate-like leads 6 and 7 in which there are formed groove portions 6h and 7h whose one end is in communication with either a first through hole 6c or a second through hole 7c and the other end is in communication with either a through hole 6f or a through hole 7f. Furthermore, FIGS. 38 and 39 show structures of the first and second plate-like leads 6 and 7 which are used for the passive component 5 of FIGS. 36 and 37. As shown in FIGS. 38 and 39, the through hole 6f is formed in a periphery of (a) the first electrode part 6b of the first plate-like lead 6 and a third concave portion 6d is formed in the first electrode part 6b. At the same time, there is formed in each first electrode part 6b a groove portion 6h whose one end is in communication with the first through hole 6c and the other end is in communication with the through hole 6f.

The groove portion 6h is a guide passage for discharging, from a joint portion of a jointing material 13, an out gas which is produced when the jointing material 13 such as solder or a conductive resin adhesive is baked (cured). The groove portion 6h is so formed that one end thereof is in communication with a portion (the first electrode part 6b) in contact with the jointing material 13 and the other end thereof is in communication with the through hole 6f.

Similarly, the groove portion 7h is also a guide passage for discharging, from the joint portion of the jointing material 13, an out gas which is produced when the jointing material 13 is baked. The groove portion 7h is so formed that one end thereof is in communication with a portion (the second electrode part 7b) in contact with the jointing material 13 and the other end thereof is in communication with the through hole 7f.

Because the groove portions 6h and 7h are formed as above, the out gas produced when baking (curing) the jointing material 13 can be discharged through the groove portions 6h and 7h. Thus, formation of void at the joint made by the jointing material 13 can be suppressed. As a result, stabilization of the quality can be attained.

Since the formation of the void is suppressed, adhesive strength of the jointing material 13 can be raised. Also, the joining strength between the electrode part and the external terminal 5b of the passive component 5 can be enhanced.

As shown in FIG. 38, the third and fourth concave portions 6d and 7d are formed in the corner portions of the first electrode part 6b of the first plate-like lead 6 and the second electrode part 7b of the second plate-like lead 7, respectively. At the same time, ends of the groove portions 6h and 7h are in communication with corner portions of the third and fourth concave portions 6d and 7d, respectively. Further, the passive component 5 is coupled, as shown in FIGS. 36 and 37, to the four third and fourth concave portions 6d and 7d. Therefore, the out gas at the corners where voids are liable to be formed can be discharged through the groove portions 6h and 7h, suppressing the formation of the void. Thus, stabilization of the quality of the semiconductor package 1 can be attained.

Tenth Embodiment

Figure 40:
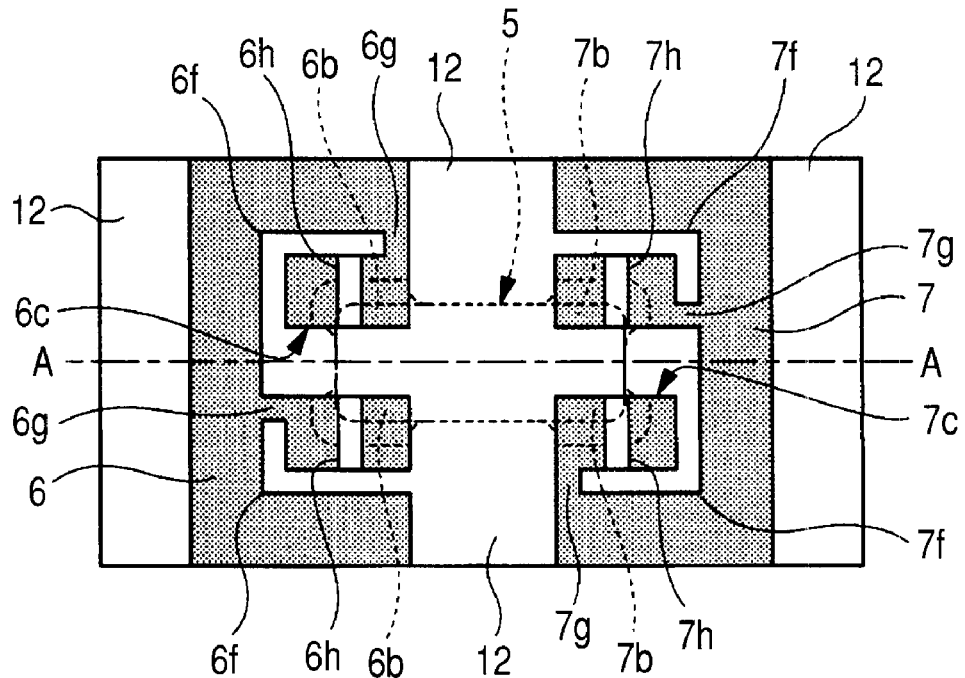
FIG. 40 is a plan view showing a structure of the first and second plate-like leads of a modification of the structure shown in FIG. 36.
Figure 41:
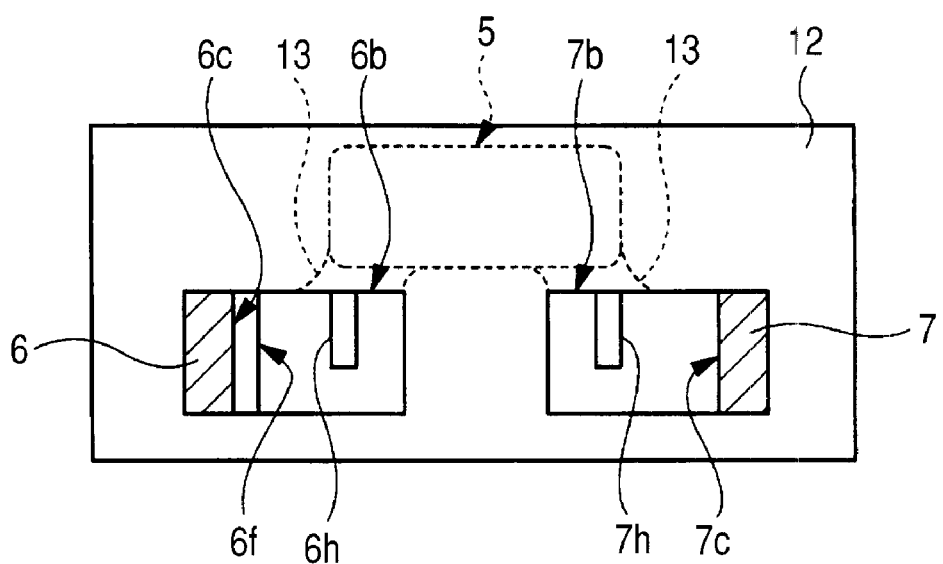
FIG. 41 is a sectional view showing an example of the structure cut along a line A-A in FIG. 40.

FIG. 40 is a plan view showing structures of the first and second plate-like leads of the modification of the structure shown in FIG. 36. FIG. 41 is sectional view showing an example of the structure cut along a line A-A line in FIG. 40. The lead shape of the modification shown in FIGS. 40 and 41 is the case of a flat electrode part in which the third and fourth concave portions 6d and 7d of FIG. 38 are not formed in each electrode part. In such a case also, the effects similar to the ones by the structures of FIGS. 38 and 39 can be obtained, and the shape of the lead can be formed easily.

Eleventh Embodiment

Figure 42:
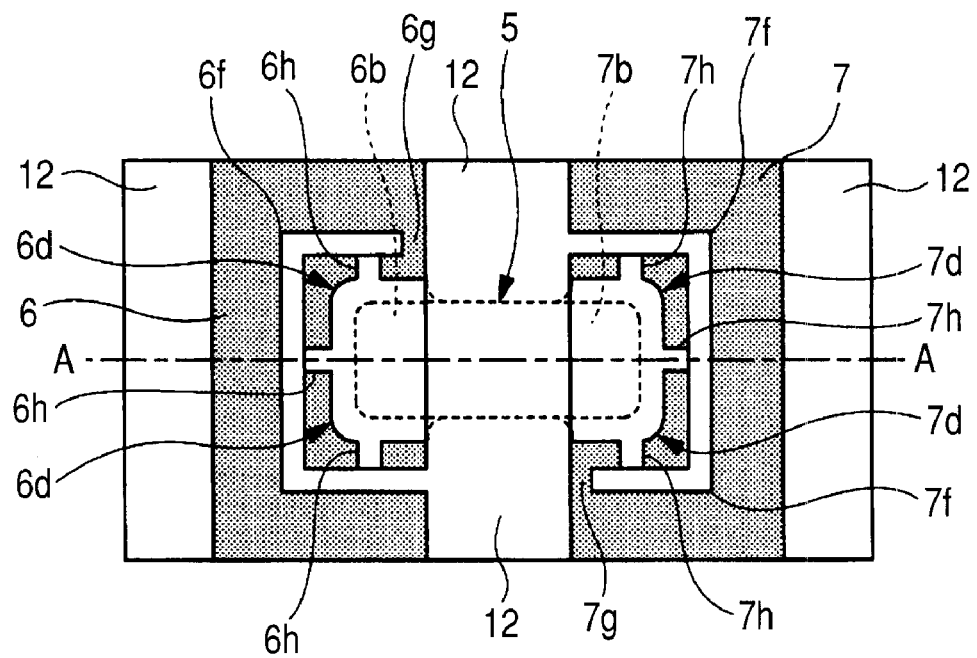
FIG. 42 is a plan view showing a structure of the first and second plate-like leads of a modification of the structure shown in FIG. 36.
Figure 43:
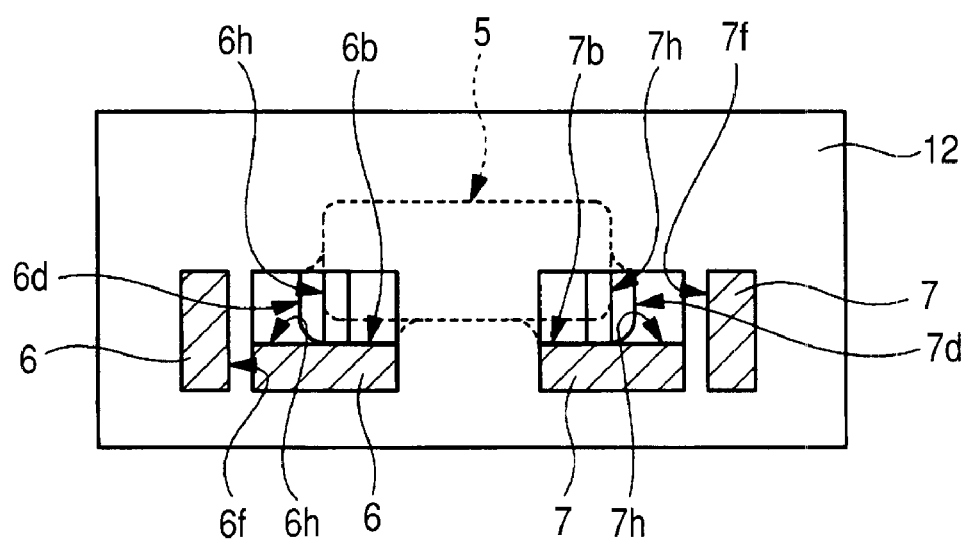
FIG. 43 is a sectional view showing an example of the structure cut along a line A-A in FIG. 42.

FIG. 42 is a plan view showing structures of the first and second plate-like leads of the modification of the structure shown in FIG. 36. FIG. 43 is a sectional view showing an example of the structure cut along a line A-A in FIG. 42. The modification shown in FIGS. 42 and 43 is the one in which, in the first plate-like lead 6 where the first through hole 6c is not formed, a groove portion 6h is formed such that one end thereof is in communication with the third concave portion 6d of the first electrode part 6b. In this case also, the out gas at the joint formed by the jointing material 13 can be discharged through the groove portion 6h, which suppresses the formation of the void in the jointing material 13. This holds true of the side of the second electrode part 7b of the second plate-like lead 7.

Twelfth Embodiment

Figure 44:
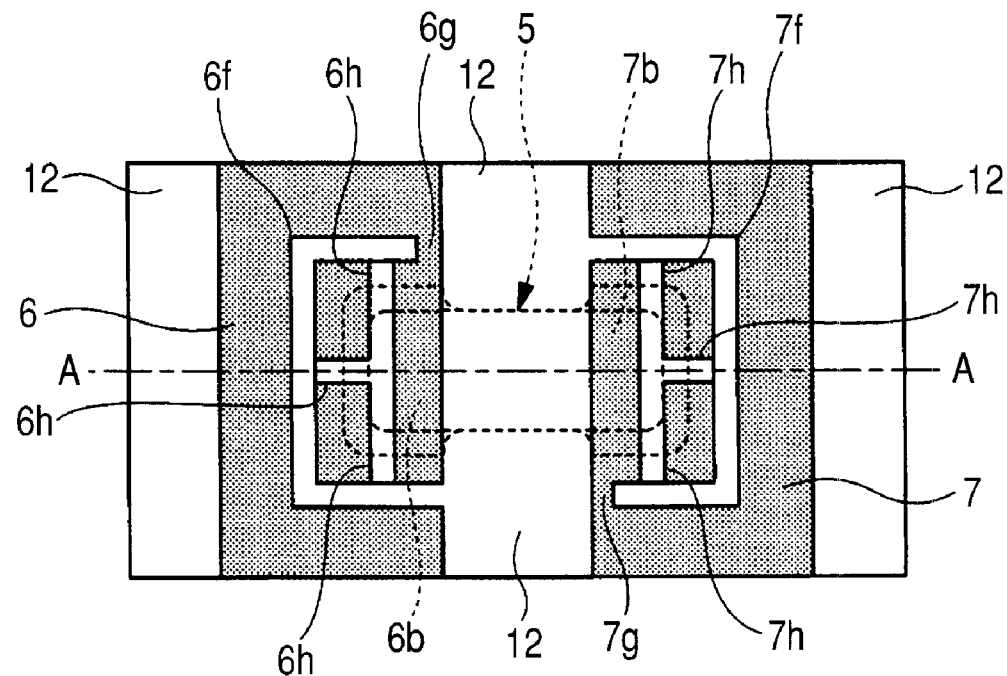
FIG. 44 is a plan view showing a structure of the first and second plate-like leads of a modification of the structure shown in FIG. 36.
Figure 45:
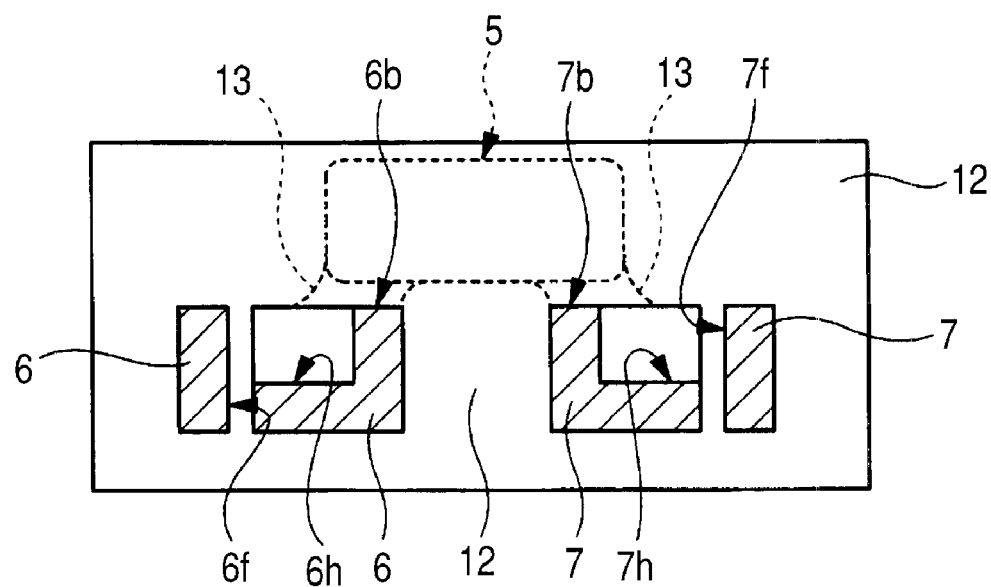
FIG. 45 is a sectional view showing an example of the structure cut along a line A-A in FIG. 44.

FIG. 44 is a plan view showing structures of the first and second plate-like leads of the modification of the structure which is shown in FIG. 36. FIG. 45 is a sectional view showing an example of the structure cut along a line A-A in FIG. 44. The lead shape of the modification shown in FIGS. 44 and 45 is the one in the case of a flat electrode part in which the third and fourth concave portions 6d and 7d of FIG. 42 are not formed in each electrode part. Also in this case, the effects similar to the ones by the structures of FIGS. 42 and 43 can be obtained, and the shape of the lead can be formed easily.

Thirteenth Embodiment

Figure 46:
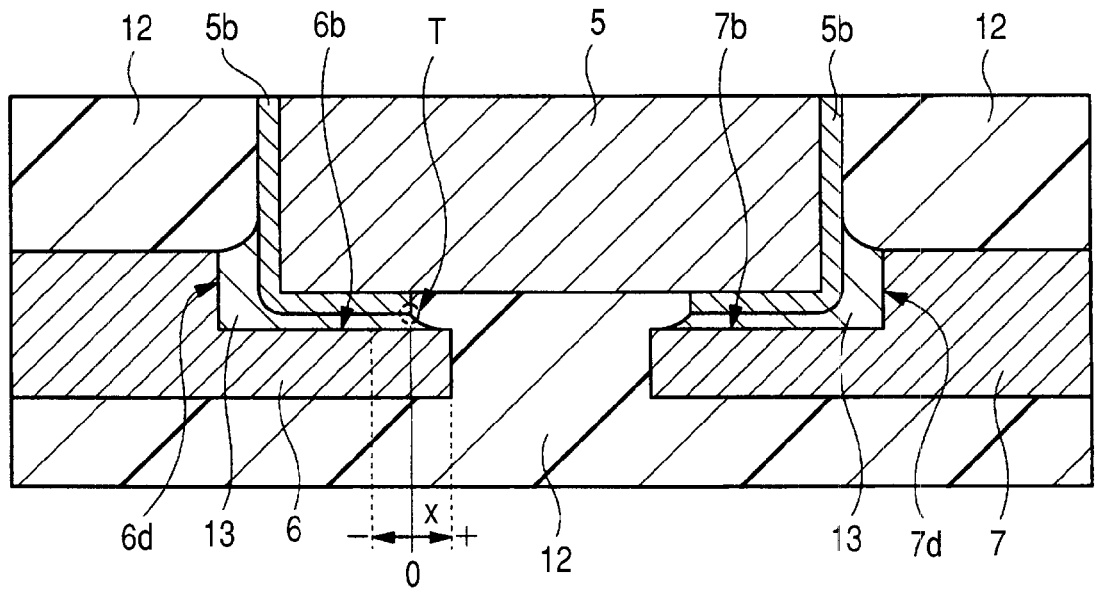
FIG. 46 is a partial sectional view showing an example of a structure of the relation between an adhesive stress and a frame position at the plate-like lead of a thirteenth embodiment of the present invention.
Figure 47:
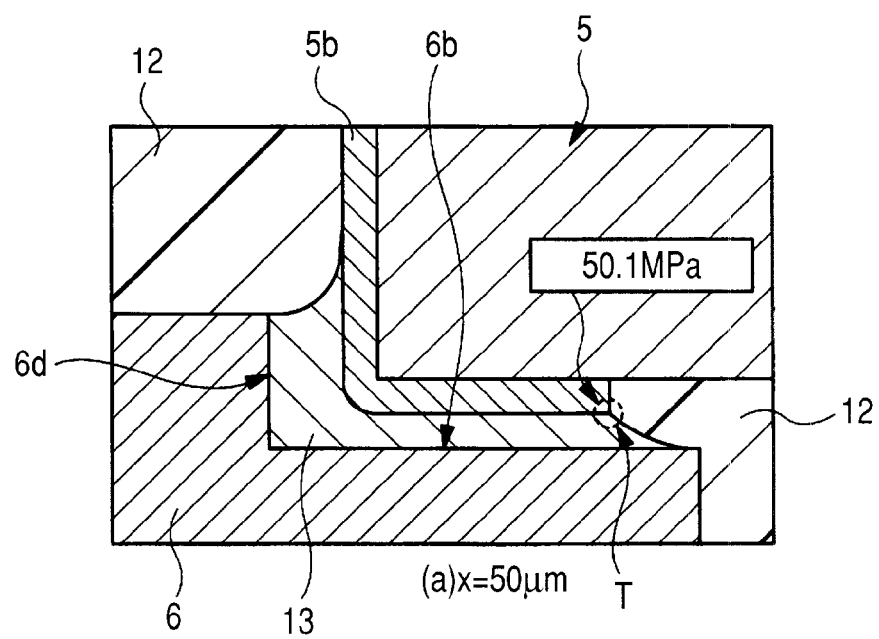
FIG. 47 is a stress distribution chart showing an example of a main stress distribution of the adhesive in a first example of the structure of the relation between the adhesive stress and the frame position shown in FIG. 46.
Figure 48:
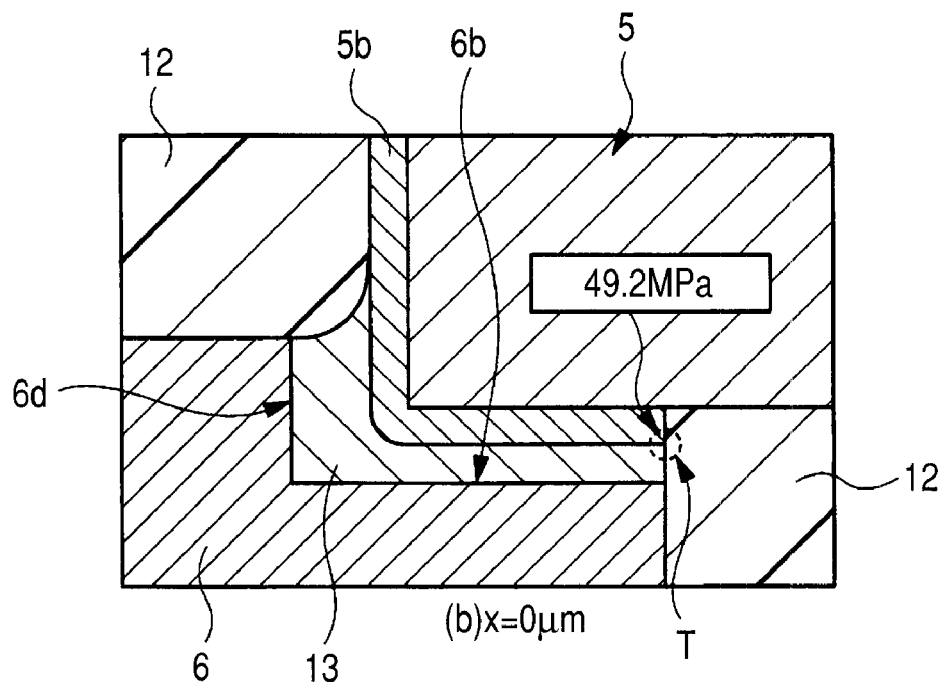
FIG. 48 is a stress distribution chart showing an example of a main stress distribution of the adhesive in a second example of the structure of the relation between the adhesive stress and the frame position shown in FIG. 46.
Figure 49:
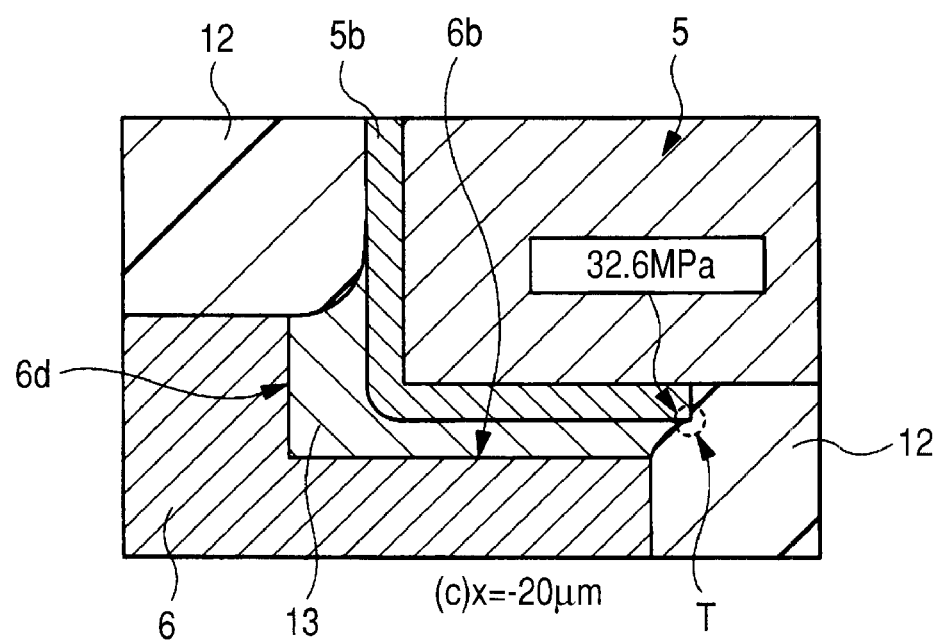
FIG. 49 is a stress distribution chart showing an example of a main stress distribution of the adhesive in a third example of the structure of the relation between the adhesive stress and the frame position shown in FIG. 46.
Figure 50:
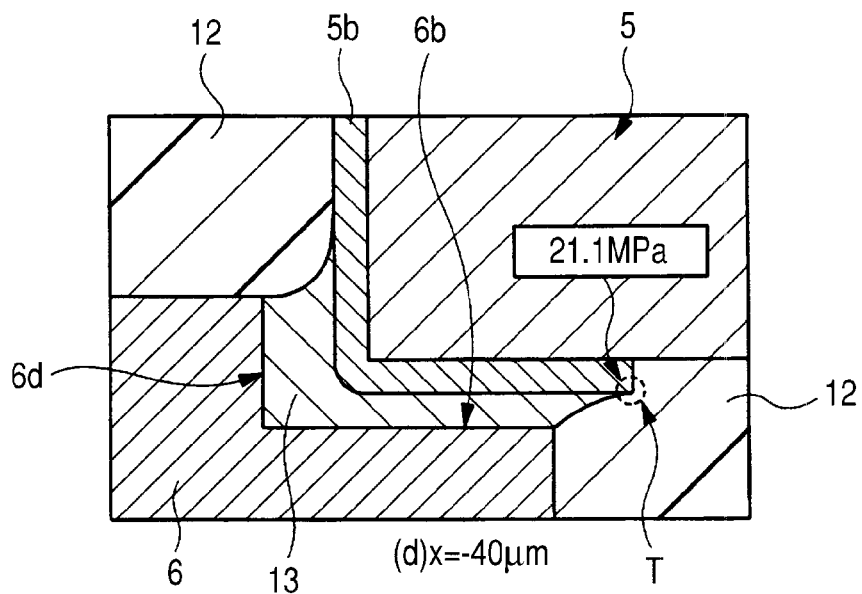
FIG. 50 is a stress distribution chart showing an example of the main stress distribution of the adhesive in a fourth example of the structure of the relation between the adhesive stress and the frame position shown in FIG. 46.
Figure 51:
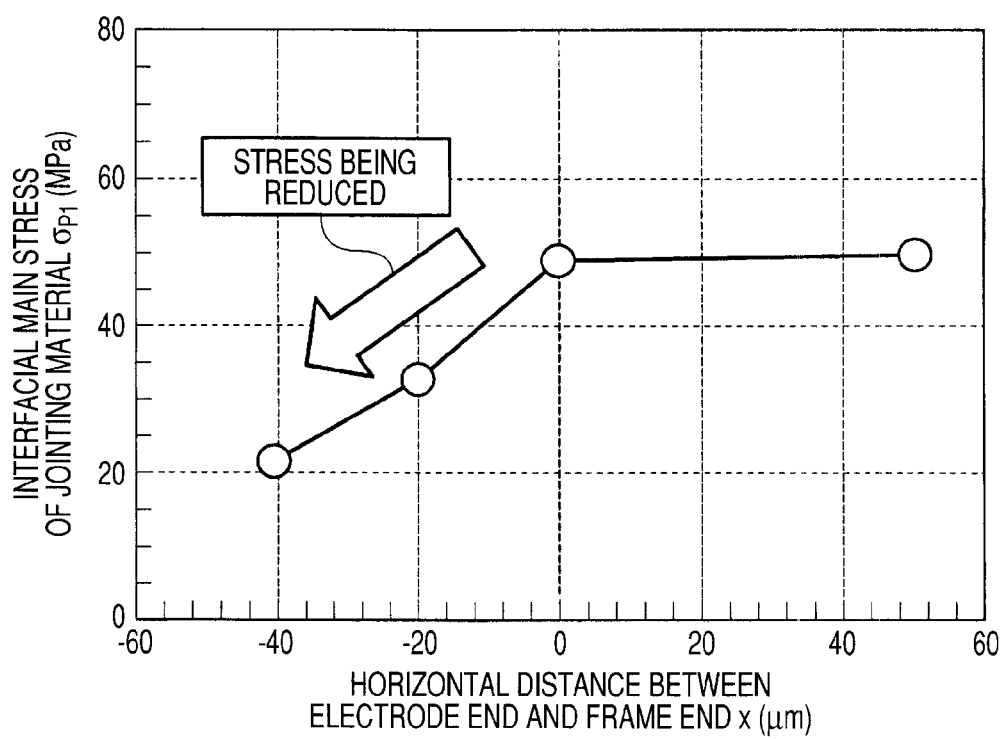
FIG. 51 is a main stress data chart showing main stress values of the adhesives in the structures of the relation between the adhesive stresses and the frame positions shown in FIGS. 47 to 50.

FIG. 46 is a partial sectional view showing an example of the structure of the relation between the adhesive stress and the frame position in the plate-like lead of a thirteenth embodiment of the present invention. FIG. 47 is a stress distribution chart showing an example of the main stress distribution of the adhesive in a first example of the structure of the relation between the adhesive stress and the frame position shown in FIG. 46. FIG. 48 is a stress distribution chart showing an example of the main stress distribution of the adhesive in a second example of the structure of the relation between the adhesive stress and the frame position shown in FIG. 46. Moreover, FIG. 49 is a stress distribution chart showing an example of the main stress distribution of the adhesive in a third example of the structure of the relation between the adhesive stress and the frame position shown in FIG. 46. FIG. 50 is a stress distribution chart showing an example of the main stress distribution of the adhesive in a fourth example of the structure of the relation between the adhesive stress and the frame position shown in FIG. 46. FIG. 51 is a main stress data chart showing main stress values of the adhesives in the structures of the relation between the adhesive stress and the frame positions shown in FIGS. 47 to 50.

At the first electrode part 6b of the first plate-like lead 6 and the second electrode part 7b of the second plate-like lead 7, the thirteenth embodiment shows, when forming the third and fourth concave portions 6d and 7d, the relation between positions of ends of the third and fourth concave portions 6d and 7d and the stress at the jointing material.

In the structure shown in FIG. 46, assuming that the end of the external terminal 5b of the passive component 5 is a 0 (zero) point, the distance (x) from the 0 point to the lead end is distributed to + and −. Further, the stress value of a T region (a boundary portion between the end of the external terminal 5b of the passive component 5 and the jointing material 13) at each position is shown on a vertical axis and a simulation is performed.

Further, in the simulation, the first and second plate-like leads 6 and 7 were made of an alloy of copper and their thermal expansion coefficient was about 18 ppm/k. The passive component 5 was made of ceramics and its thermal expansion coefficient was about 5 ppm/k. The mould resin was a epoxy resin and its thermal expansion coefficient was about 15 ppm/k.

As shown in FIG. 47, when the distance (x) between the external terminal 5b of the passive component 5 and the lead end was 50 µm, the stress applied to the T region was 50.1 MPa. Moreover, as shown in FIG. 48, when the distance (x) between the external terminal 5b of the passive component 5 and the lead end was 0 µm, the stress applied to the T region was 49.2 MPa. Moreover, as shown in FIG. 49, when the distance (x) of the external terminal 5b of the passive component 5 and the lead end was −20 µm, the stress applied to the T region was 32.6 MPa. Still further, as shown in FIG. 50, when the distance (x) between the external terminal 5b of the passive component 5 and the lead end was −40 µm, the stress applied to the T region was 21.1 MPa.

Therefore, as shown in FIG. 51, such a result was obtained that the smaller the distance (x) from the 0 point to the lead end is (in FIG. 46, the farther the position of the lead edge is set in the minus (−) direction), the smaller the stress becomes. In particular, it is seen that the stress is reduced by lowering the lead end below the 0 (zero) point.

That is, when joining passive component 5 in third and fourth concave portions 6d and 7d at each electrode part, with respect to the longitudinal direction of the passive component 5, it is preferred that positions of inner ends of the first electrode part 6b of the first plate-like lead 6 and the second electrode part 7b of the second plate-like lead 7 are set on an outer side of a position of the inner end of the external terminal 5b of the passive component 5. In this way, the stress applied to the boundary portion between the external terminal 5b and the jointing material 13 can be reduced. As a result, separation of the jointing material 13 from the external terminal 5b can be suppressed, improving the quality of the semiconductor package 1.

In the foregoing, the invention made by the inventors thereof has been concretely described based on the embodiments. However, it goes with out saying that the present invention is not limited to the foregoing embodiments and the various changes and modifications can be made within the scope of the invention.

For example, in the first to thirteenth embodiments, the case where each plate-like lead is made of an alloy of copper has been described. However, the plate-like lead may be made of an alloy other than that, namely, an alloy of iron and nickel, or the like.

Further, in the sixth to twelfth embodiments, the case where the fifth concave portions are the through holes 6f and 7f has been described. However, the fifth concave portion does not necessarily have to be a through hole, and it may be a recess instead. Even so, it is desirable that the fifth concave portion is a through hole.

Also, the description has been directed to the semiconductor device in which the semiconductor chip in which the power MOSFET for the DC-DC converter circuit is formed and the semiconductor chip in which the driver circuit is formed are integrated as one package. However, the present invention can be applied to the case where those semiconductor chips are not integrated as one package.

Further, although the DC-DC converter circuit has been described, the present invention can be applied to the case of semiconductor chips in which other circuits are formed.

The present invention can be preferably applied to an electric device on which a passive component is mounted.

What is claimed is:

1. A semiconductor device having semiconductor chips and a passive component mounted over a plate-like lead respectively, the semiconductor device comprising:
   a first plate-like lead having a first electrode part electrically coupled to an external terminal at one end of said passive component at the both ends of which external terminals are formed, said first electrode part being provided with a first concave portion;
   a second plate-like lead having a second electrode part spaced from said first plate-like lead and electrically coupled to an external terminal at the other end of said passive component, said second electrode part being provided with a second concave portion;

jointing materials electrically coupling said first electrode part of said first plate-like lead with one said external terminal of said passive component and, also, said second electrode part of said second plate-like lead with the other said external terminal of said passive component, respectively; and sealing members for sealing said passive component and said semiconductor chip with a resin, wherein, at said first electrode part of said first plate-like lead, said one external terminals of said passive component are coupled to said first electrode parts on both sides of said first concave portion being laid across said first concave portion;

wherein, at said second electrode part of said second plate-like lead, the other said external terminals of said passive component are coupled to said second electrode parts on both sides of said second concave portion being laid across said second concave portion;

wherein the external terminals of said passive component are coupled, at four corners, to either said first electrode part of said first plate-like lead or said second electrode part of said second plate-like lead using said jointing materials; and wherein a region between the external terminals at both the sides of said passive component is surrounded by part of said sealing member.

2. A semiconductor device having semiconductor chips and a passive component mounted over a plate-like lead respectively, the semiconductor device comprising:

a first plate-like lead having a first electrode part electrically coupled to an external terminal at one end of said passive component at the both ends of which external terminals are formed, said first plate-like lead being provided with a pair of first concave portions sandwiching said first electrode part;

a second plate-like lead having a second electrode part spaced from said first plate-like lead and electrically coupled to an external terminal at the other end of said passive component, said second plate-like lead being provided with a pair of second concave portions sandwiching said second electrode part;

jointing materials electrically coupling said first electrode part of said first plate-like lead with said one external terminal of said passive component and, also, said second electrode part of said second plate-like lead with the other said external terminal of said passive component respectively; and sealing members for sealing said passive component and said semiconductor chips with a resin, wherein, at said first electrode part of said first plate-like lead, said one external terminal of said passive component is coupled to said first electrode part while being laid across the pair of said first concave portion so provided as to sandwich said first electrode part, wherein, at said second electrode part of said second plate-like lead, the other said external terminal of said passive component is coupled to said second electrode part while being laid across the pair of said second concave portions so provided as to sandwich said second electrode part, and wherein a region between the external terminals at both the sides of said passive component is surrounded by part of said sealing members.

3. A semiconductor device according to claim 1, wherein a third concave portion shallower than said first concave portion is formed in a corner portion of said first electrode part of said first plate-like lead and a fourth concave portion shallower than said second concave portion is formed in a corner portion of said second electrode part of said second plate-like lead, and wherein said passive components are coupled to two said third concave portions and two said fourth concave portions.

4. A semiconductor device according to claim 3, wherein said first and second concave portions are through holes.

5. A semiconductor device according to claim 2, wherein a third concave portion shallower than said first concave portion is formed in said first electrode part of said first plate-like lead and a fourth concave portion shallower than said second concave portion is formed in said second electrode part of said second plate-like lead, and wherein said passive component is coupled to said third and fourth concave portions.

6. A semiconductor device according to claim 5, wherein said first and second concave portions are through holes.

7. A semiconductor device according to claim 3, wherein the relation between a concave depth (b) of said third and fourth concave portions and a support thickness (a) is: (a)< (b).

8. A semiconductor device according to claim 3, wherein the relation between a concave depth (b) of said third and fourth concave portions and a support thickness (a) is: (a)> (b).

9. A semiconductor device according to claim 3, wherein the relation between a concave depth (b) of said third and fourth concave portions and a support thickness (a) is: (a)= (b).

10. A semiconductor device according to claim 1, wherein a fifth concave portion is formed around said first electrode part of said plate-like lead and said second electrode part of said second plate-like lead, respectively.

11. A semiconductor device according to claim 10, wherein a width of said fifth concave portion is smaller than a width of each of said first concave portion and said second concave portion and, also, smaller than a width of said gap between said first plate-like lead and said second plate-like lead.

12. A semiconductor device according to claim 10, wherein said fifth concave portion is so provided as to surround said passive component.

13. A semiconductor device according to claim 10, wherein there is provided a groove portion whose one end is in communication with either said first concave portion or said second concave portion and the other end is in communication with said fifth concave portion.

14. A semiconductor device according to claim 13, wherein a third concave portion shallower than said first concave portion is formed in a corner portion of said first electrode part of said first plate-like lead and a fourth concave portion shallower than said second concave portion is formed in a corner portion of said second electrode part of said second plate-like lead, and wherein said passive component is coupled to two said third concave portions and two said fourth concave portions.

15. A semiconductor device according to claim 14, wherein said one end of said groove portion is in communication with said third and fourth concave portions.

16. A semiconductor device according to claim 15, wherein said one end of said groove portion is in communication with corner portions of said third and fourth concave portions.

17. A semiconductor device according to claim 3, wherein said passive component is coupled to said third and fourth concave portions such that, with respect to a longitudinal direction of said passive component, positions of inner ends of said first electrode part of said first plate-like lead and said second electrode part of said second plate-like lead are set outwardly of a position of an inner end of said external terminal of said passive component.

18. A semiconductor device according to claim 5, wherein said passive component is coupled to said third and fourth concave portions such that, with respect to a longitudinal direction of said passive component, positions of inner ends of said first electrode part of said first plate-like lead and said second electrode part of said second plate-like lead are set outwardly of a position of an inner end of said external terminal of said passive component.

19. A semiconductor device having a DC-DC converter, comprising:
- a first semiconductor chip mounted over a first lead frame in which a high-side MOSFET being a component for said DC-DC converter is formed;
- a second lead frame opposed to said first lead frame;
- a second semiconductor chip mounted over a third lead frame in which a low-side MOSFET being a component for said DC-DC converter is formed;
- a third semiconductor chip, mounted over a fourth lead frame, in which a driver circuit for driving said high-side MOSFET and low-side MOSFET is formed;
- a passive component having two terminals; and
- an insulating resin covering said first to third semiconductor chips and said passive component,
- wherein said second semiconductor chip is electrically coupled to said second lead frame,
- wherein concave portions are formed at positions to which said first and second lead frames are opposed respectively, and
- wherein the two terminals of said passive component are respectively fixed, through conductive jointing materials, in the concave portions formed in said first and second lead frames.

20. A semiconductor device according to claim 19, wherein, near a central portion of said concave portion, there are formed through holes passing through said first and second lead frames, respectively.

21. A semiconductor device according to claim 19, wherein said first lead frame and said second lead frame are coupled through capacitive coupling.

22. A semiconductor device according to claim 21,
wherein said passive component comprises a capacitive element, and
wherein said first lead frame and said second lead frame are coupled through capacitive coupling.

* * * * *